(12) United States Patent
Sun et al.

(10) Patent No.: US 12,094,630 B2
(45) Date of Patent: Sep. 17, 2024

(54) MILLIMETER THICK MAGNETIC PCB WITH HIGH RELATIVE PERMEABILITY AND DEVICES THEREOF

(71) Applicant: Winchester Technologies, LLC, Burlington, MA (US)

(72) Inventors: Nian-Xiang Sun, Winchester, MA (US); Xiaoling Shi, Acton, MA (US); Hui Lu, Winchester, MA (US)

(73) Assignee: WINCHESTER TECHNOLOGIES, LLC, Winchester, MA (US)

( * ) Notice: Subject to any disclaimer, the term of this patent is extended or adjusted under 35 U.S.C. 154(b) by 0 days.

(21) Appl. No.: 17/503,873

(22) Filed: Oct. 18, 2021

(65) Prior Publication Data

US 2022/0165466 A1 May 26, 2022

Related U.S. Application Data

(60) Provisional application No. 63/116,827, filed on Nov. 21, 2020.

(51) Int. Cl.
| | |
|---|---|
| *H01F 10/20* | (2006.01) |
| *B32B 5/02* | (2006.01) |
| *B32B 5/26* | (2006.01) |
| *H01F 1/34* | (2006.01) |
| *H01F 41/24* | (2006.01) |
| *H05K 1/09* | (2006.01) |
| *H05K 3/46* | (2006.01) |

(52) U.S. Cl.
CPC ............. *H01F 1/34* (2013.01); *B32B 5/024* (2013.01); *B32B 5/263* (2021.05); *H01F 10/20* (2013.01); *H01F 41/24* (2013.01); *H05K 1/09* (2013.01); *H05K 3/462* (2013.01); *H05K 3/4644* (2013.01)

(58) Field of Classification Search
CPC . H01F 1/34; H01F 10/20; H01F 41/24; B32B 5/024; B32B 5/263; H05K 1/09; H05K 3/462; H05K 3/4644; H05K 2201/10098; H05K 1/036; H05K 2201/086; H05K 1/165; H05K 1/02; H05K 1/0306; H05K 3/00; H01Q 7/08
See application file for complete search history.

(56) References Cited

U.S. PATENT DOCUMENTS

| | | | | |
|---|---|---|---|---|
| 6,611,035 | B2* | 8/2003 | Inoue | H01F 41/046 |
| | | | | 257/528 |
| 2003/0003324 | A1* | 1/2003 | Fleming | C03C 17/25 |
| | | | | 427/427 |
| 2003/0062965 | A1* | 4/2003 | Jensen | H05K 1/0233 |
| | | | | 174/256 |
| 2009/0040126 | A1* | 2/2009 | Inoue | H05K 9/0083 |
| | | | | 343/841 |
| 2014/0302344 | A1* | 10/2014 | Petuskey | B32B 37/14 |
| | | | | 156/308.2 |
| 2016/0227643 | A1* | 8/2016 | Toyota | H05K 1/0236 |
| 2017/0156210 | A1* | 6/2017 | Kegeler | H01F 3/10 |
| 2018/0302986 | A1* | 10/2018 | Sturcken | H05K 1/165 |
| 2019/0045624 | A1* | 2/2019 | Weidinger | H05K 3/4658 |
| 2019/0157242 | A1* | 5/2019 | Moitzi | H01L 24/94 |
| 2020/0227358 | A1* | 7/2020 | Kikitsu | H01F 10/16 |

* cited by examiner

*Primary Examiner* — Steven T Sawyer
(74) *Attorney, Agent, or Firm* — Jie Tan; JT Law Services, PC

(57) ABSTRACT

A magnetic PCB generated by simultaneously spin-spraying a ferrite ion solution and an oxidant solution on a substrate plate while the substrate plate is rotated at a speed 40 rpm to about 300 rpm and heated at 40° C. to 300° C.

14 Claims, 28 Drawing Sheets

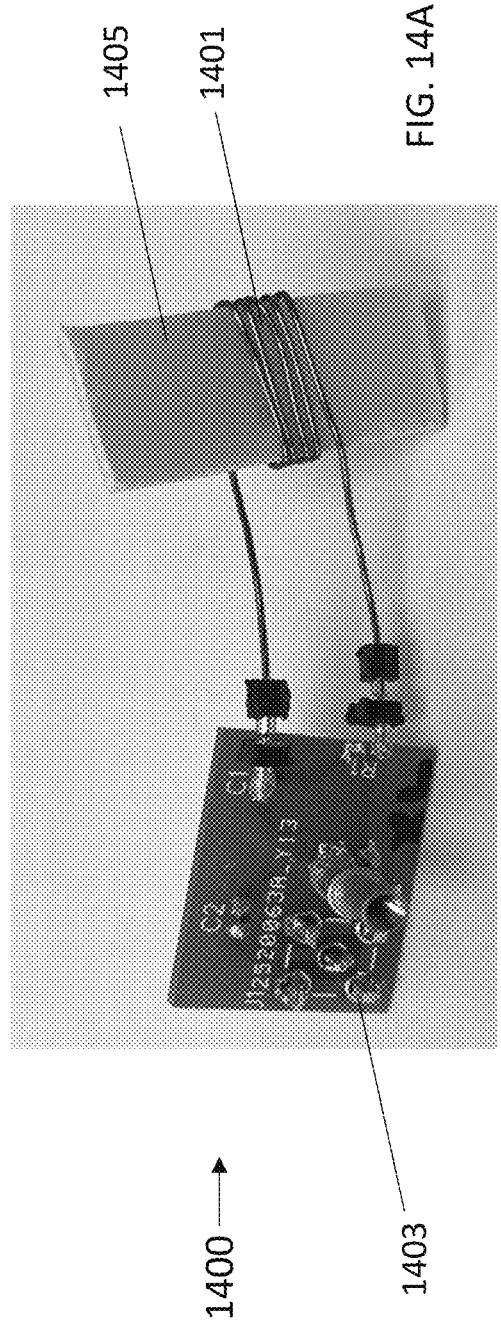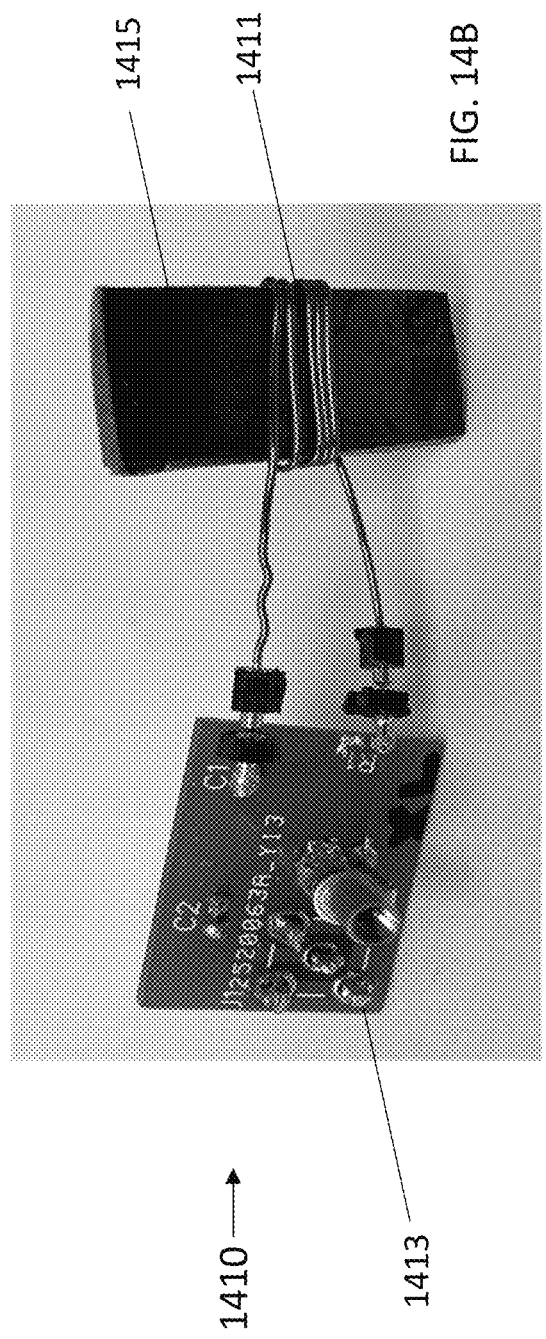
FIG. 14A
FIG. 14B

MILLIMETER THICK MAGNETIC PCB WITH HIGH RELATIVE PERMEABILITY AND DEVICES THEREOF

CROSS-REFERENCES

Priority is claimed from the U.S. Provisional Patent Application No. 63/116,827, filed on Nov. 21, 2020, entitled "Millimeter thick magnetic print circuit boards (PCBs) with a high relative permeability of 50~150 and related devices and systems", the entirety of which is thereby incorporated by reference.

This invention was made with government support under contract number W9113NF18C0098 awarded by Army Research Office, 800 Park Office Drive, Suite 4229, Research Triangle Park NC 27709. The government has certain rights in the invention.

BACKGROUND

Field of the Invention

The present patent application relates to the technology of generating magnetic print circuit boards (PCBs). More particularly, the present patent application provides a millimeter thick magnetic PCB with high relative permeability and high operating frequency using spin spray deposition of ferrite film technology.

Description of the Related Art

Antennas are the beginning and ending points for many systems and with a growing number of wireless applications, there's a greater demand for efficient, miniature low-profile antennas. In general, the size of an antenna increases as the frequency used by the antenna decreases. Using non-magnetic PCB with a dielectric constant in the range of 2~13, to manufacture an antenna for UHF or VHF, the PCB antenna length is in the range of several tens of centimeters. This long antenna is not suitable for mobile terminals and devices.

Technologies for reducing antenna sizes by manufacturing a substrate using a dielectric with a high dielectric constant and forming a radiating pattern on the substrate have been developed and used. However, these techniques inevitably reduce the gain and bandwidth of the antenna. An antenna using a dielectric with a high dielectric constant is therefore not suitable for devices that require an antenna with a broad bandwidth and high gain.

Wide bandwidth antennas are required to be capable of adjusting operating characteristics to adapt to changing channel conditions. Researches have discovered that tunable materials such as ferroelectric and ferromagnetic substrates provides excellent starting points for wideband antenna designs, especially magnetic materials with high resistivity for high-frequency antennas. Ferrimagnetic oxides have unique properties when a magnetic field is applied. Ferrimagnetic oxides, with iron oxide as their main component, are classified as spinels, garnets, and hexaferrites. It has been discovered that garnets are typically good for antennas from 1 to 10 GHz, spinels are commonly used for applications from 3 to 30 GHz, hexaferrites are used for higher-frequency designs, as high as 100 GHz.

Ferrites also typically have high permittivity and low dielectric losses, with flexible magnetic properties. Magnetodielectric materials exhibit relative permittivity ($\varepsilon r$) and relative permeability ($\mu r$) of greater than one. By depositing magnetodielectric substrate material with moderate values of permittivity and permeability on a PCB, it has been possible to miniaturize an antenna as much as when using a dielectric substrate material with a considerably higher value of $\varepsilon r$.

Conventional ferrite film deposition processes use pulsed laser deposition, sputtering, molecular beam epitaxy or other physical vapor deposition technologies. But these ferrite film deposition technologies are not viable for manufacturing magnetic PCBs because high temperatures (>700° C.) are needed for forming high crystalline quality ferrite materials, which will damage the polymer based PCBs. Other technologies explored including integrating ferrite materials inside PCBs, but incorporation of ferrite powders inside PCBs led to large magnetic loss tangents, low relative permeability values (1~3), and low operation frequency (<300 MHz).

The inventors of this patent application developed a novel spin spray technology to deposit ferrite films on PCBs for manufacturing magnetic PCBs. Because spin spray deposition produces thin film geometry with dense nanocrystalline ferrite crystal sizes and large shape anisotropy, the deposited ferrite films on PCBs have the potential of operating from DC to several GHz with high relative permeability of over 100 and low loss tangents. This patent application provides various such device examples and embodiments.

ASPECTS AND SUMMARY OF THE INVENTION

Embodiments of the invention provide a novel ferrite layer formation process that is performed at a lower temperature than conventional ferrite formation processes. The formation process produces highly anisotropic structures.

In one aspect of an embodiment, a ferrite layer is deposited on a substrate to form a coated substrate by spin spray deposition using the spin-spray machine developed by the inventors. During deposition, a substrate is heated on a rotation platform. Metals reactant solution and oxidizer solution are respectively provided to substrate via nozzles while the substrate is rotated. The metals solution is an aqueous solution including two or more salts, such as chlorides of iron, nickel, zinc, manganese, or other metal with a valence of two. The oxidizer solution is an aqueous solution of an oxidizing agent, for example, sodium nitrite and buffer solution. In one aspect, the reactant and oxidant solutions are provide in the form of atomizing liquid droplets, promoting a more uniform temperature on the substrate.

In one aspect of an embodiment, the rotation rate, pH, fluid flow, and temperature of the heating is adjusted to achieve a desired spinel ferrite. In one example, a FR4 substrate is mounted on a 24" disc rotating at 90 rpm. The platform on which the substrate is positioned is heated to a temperature up to 100° C., or alternatively up to 200° C., or up to 300° C. The flow rate of the reactant and the oxidant is automated at a selected rate between 5 mL/min and 100 mL/min. The rotation rate and temperature is monitored. As such, a ferrite layer is deposited on a FR4 or other substrate. The process is particularly applicable to spin coating processes. This process may be performed at temperatures less than 300° C., and even more advantageously at temperatures below 100° C.

In another embodiment, a thin film ferrite laminate is fabricated by forming a layered substrate assembly including two or more coated FR4 substrates, each substrate having a ferrite thin film, or layer, opposite a thermoplastic surface, and heating the layered assembly to form a film ferrite laminate. The layered assembly is formed such that a ferrite layer on a first coated substrate contacts a thermoplastic surface of the second coated substrate. In an example, the layered assembly is formed by stacking two or more coated substrates, one on top of another.

In one aspect, the coated substrates used to form a layered assembly have substantially uniform dimensions. The surface area, shape, and thickness of the substrates are not limited. In one example, a substrate is in a circular shape that has a diameter between 2 inch and 12 inch. In another example, a substrate is rectangular with the dimension of 1 feet by 1 feet. The thickness of the ferrite substrates may be in a range between 100 μm and 4 mm. In some cases, the thickness of one or more of the ferrite layers is between 100 μm and 1 mm.

In one embodiment, an antenna is made by using a high permeability magnetic PCBs to increase the gain, efficiency and bandwidth, while keeping the antenna size as small as conventional antennas using dielectric with high dielectric constant.

In one embodiment, a power inductor is produced by using low-temperature spin spray ferrite and which has improved inductance and quality factor at MHz frequencies over their air core counterparts by using the high permeability MnZn ferrite filmed PCBs.

Spin-spray deposition has several major advantages. Firstly, spin spray deposition is a low-cost wet chemistry synthesis process in aqueous solution at a low temperature of 90° C., an extremely low processing temperature. Spin spray ferrites have been deposited onto different substrates, including organic substrates such as PCBs, transparencies, glass, and ceramics by the inventors of this application. The low deposition temperature enables high quality ferrite film deposition on almost any substrate, even on organic substrates such as PCBs, transparencies, Si substrates, glass, etc. with excellent adhesion. In contrast, conventional ferrite processing temperatures are in the range of >700° C., which is incompatible with PCBs, RFIC (Radio Frequency Integrated Circuit) or MMIC (Monolithic Microwave Integrated Circuit).

Secondly, spin-spray processing is a low-cost process with a high deposition rate (>1 nm/second), which is more than an order of magnitude higher than conventional vacuum deposition techniques. In addition, the spin-spray processing can deposit conformal ferrite films onto uneven surfaces, even concave or convex surfaces.

Thirdly, the inventors have successfully demonstrated that spin-spray deposition can be combined with room temperature spin coating of polyimide or photoresist for achieving thick (>10 μm) ferrite/dielectric multilayer films with excellent RF magnetic properties, low roughness and excellent film uniformity.

Lastly, the properties of these spin spray deposited ferrite films can be further tuned by changing their compositions to provide either a high positive permeability and low loss tangent, or a high imaginary permeability and large loss tangent needed for RF wave absorber applications.

Spin spray deposition is thus a viable method that is able to produce fully dense, high crystalline quality, and low-loss RF ferrites at a low temperature (<90° C.) using aqueous solutions at a low cost, enabling direct integration of high-quality RF ferrites on PCBs and Si substrates. So far, spin spray deposition is the only reported viable method that is able to produce fully dense, high crystalline quality, low-loss and thick RF ferrite films at a low temperature (<90° C.) and using low cost aqueous solutions, which makes possible direct integration of ferrites on PCBs and RFIC and MMIC.

Ferrite films have advantages that bulk ferrite materials do not have for 0.5~3 GHz operation range, such as high permeability, high ferromagnetic resonance frequency, and wide operation frequency range, etc. For ferrite films applications, such as antennas or absorbers, that require ferrite films in millimeter thicknesses, it is demonstrated that such thickness can be effectively achieve using ferrite/insulator multilayers coated onto substrates through spin spray or linear spray; or alternatively, using multiple layers of ferrite coated ultra-thin substrates for making multilayer thick ferrites. While conventional sintered bulk ferrite materials, or ferrite powder in polymer matrix all have poor performance and cannot be used at 500 MHz and above. spin spray or linear spray ferrite film technology can provide efficient antennas operating at 500 MHz and above.

BRIEF DESCRIPTION OF THE DRAWINGS

FIG. 14A is an optical image of the T-shaped matching network with a 5-turn solenoid magneto-dielectric antenna based on a blank PCB with a size of 25.4 mm×12.7 mm×1.3 mm.

FIG. 14B is an optical image of the T-shaped matching network with a 5-turn solenoid magneto-dielectric antenna based on a Ferrite PCB with the same size of 25.4 mm×12.7 mm×1.3 mm.

DETAILED DESCRIPTION OF THE PREFERRED EMBODIMENTS

Figure 1A:
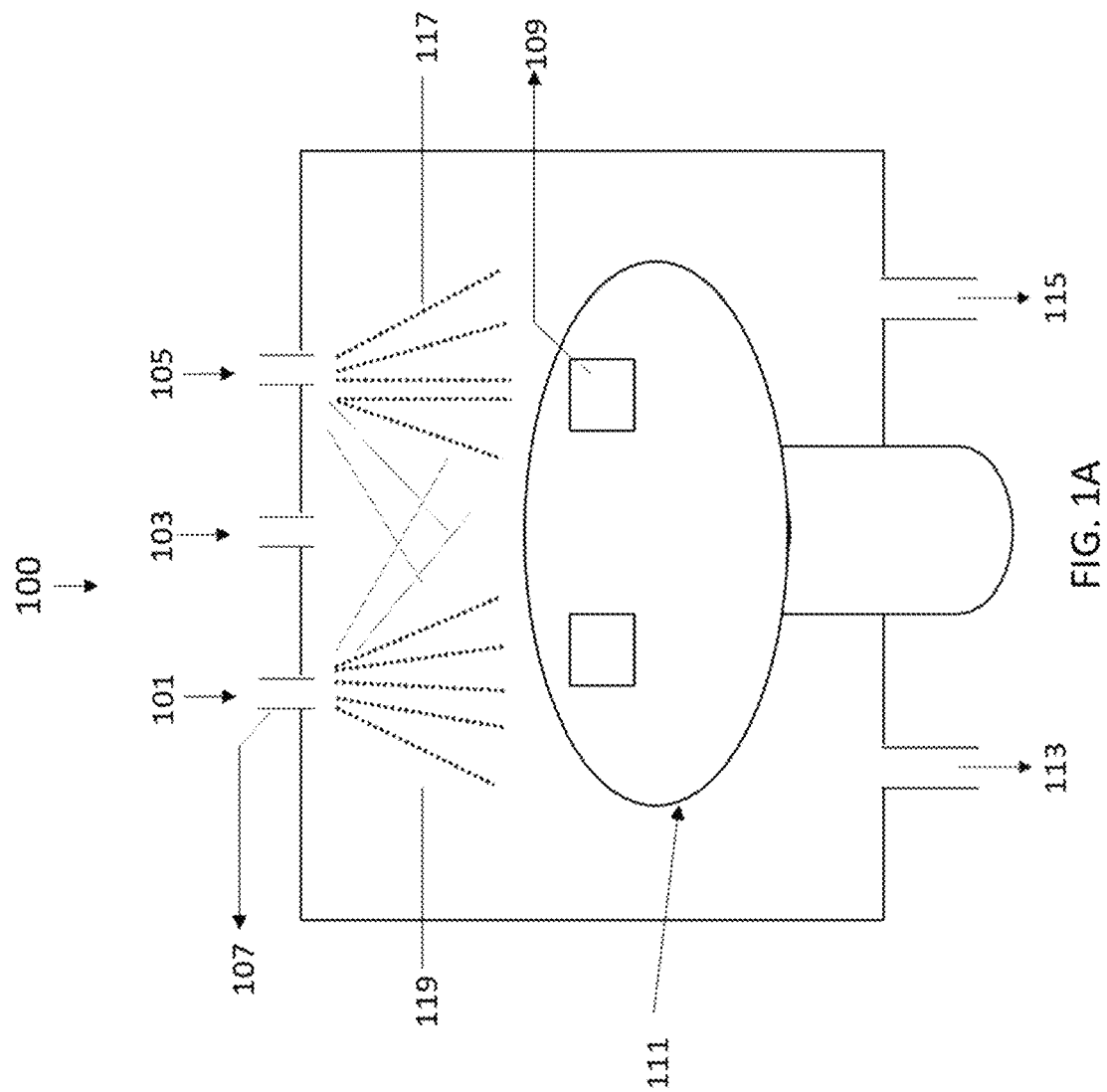
FIG. 1A is a schematic of a spin-spray deposition system in accordance with this application.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

The terms "first," "second," "third," "fourth," and the like in the description and the claims, if any, may be used for distinguishing between similar elements and not necessarily for describing a particular sequential or chronological order. It is to be understood that the terms so used are interchangeable. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

The present invention may be described herein in terms of functional block components and various processing steps. It should be appreciated that such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices.

It should be appreciated that the particular implementations shown and described herein are illustrative of the invention and its best mode and are not intended to otherwise limit the scope of the present invention in any way. Furthermore, the connecting lines shown in the various figures contained herein are intended to represent exemplary functional relationships and/or physical couplings between the various elements. It should be noted that many alternative or additional functional relationships or physical connections may be present in a practical incentive system implemented in accordance with the invention.

The term "substrate" refers to the "substrate" term in electronic engineering field, a wafer is a common example; in general substrate refers to a solid (usually planar) substance onto which a layer of another substance is applied, and to which that second substance adheres, this substance serves as the foundation upon which electronic devices such as transistors, diodes, and especially integrated circuits (ICs) are deposited.

The term "FR-4 (or FR4)" is a NEMA grade designation for glass-reinforced epoxy laminate material. FR-4 is a composite material composed of woven fiberglass cloth with an epoxy resin binder that is flame resistant.

The term permeability in this application refers to magnetic permeability. Magnetic permeability is generally measured by FMR.

The term PCB or "printed circuit board" refers to a flat sheet of insulating substrate material and a layer of copper foil, laminated to the substrate; chemical etching divides the copper layer into separate conducting lines into tracks or circuit traces, pads for connections, vias to pass connections between layers of copper. In multi-layer boards, the layers of material are laminated together in an alternating sandwich: copper, substrate, copper, substrate, copper, etc, each plane of copper is etched, and any internal vias are plated-through, before the layers are laminated together. FR-4 glass epoxy is the most common insulating substrate. Another substrate material is cotton paper impregnated with phenolic resin, often tan or brown. Laminates are manufactured by curing under pressure and temperature layers of cloth or paper with thermoset resin to form an integral final piece of uniform thickness. The size can be up to 4 by 8 feet (1.2 by 2.4 m) in width and length. Different dielectrics are used as substrate, include polytetrafluoroethylene (Teflon), FR-4, FR-1, CEM-1 or CEM-3. Well known pre-preg materials used in the PCB industry are FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester).

Commercially available PCBs are mostly not magnetic, but only dielectric with a dielectric constant in the range of 2~13. Because ferrite deposition requires greater than 700° C. processing temperature to in order to form high crystalline quality ferrite, it has been almost impossible for electronic engineers to manufacture magnetic PCBs with traditional methods. Since magnetic PCBs can lead to more compact and more power efficient antennas, inductors, and transformers, etc. and which will in turn allow for the manufacturing of electronics with much smaller sizes, less weight, and less power consumption, many efforts have been made in finding a way to deposit ferrite material on PCBs, including the recent report by Rogers Corporation who generated a type of magnetic PCBs by packing magnetic powders into polymers. However, this type of magnetic PCBs only demonstrated a magnetic relative permeability of 5, also with large loss tangents at 400~500 MHz. In addition, Rogers Corporation's method works with limited PCB sizes, but is heavy and hard to machine.

This application discloses a new way of manufacturing magnetic PCBs by spin spray deposition of high-quality low-cost thick ferrite films onto thin PCBs, such as FR4, and using prepreg or epoxy and hot-pressing for forming thick PCBs. A ferrite film is formed on a substrate during aqueous ferrite solution deposition. Substrate spinning will improve thickness uniformity of the ferrite layer formed on substrate and rinse excess oxide particles away from the substrate surface. The formation process is performed at temperatures less than about 100° C., which is particularly advantageous given the temperature sensibility of PCBs.

Embodiments of the invention may be used to deposit ferrite films on various substrate materials. Preferably deposition is at low temperatures such as about 100° C. or less. The process depends on the controlled atomization of an aqueous oxidizing solution and an aqueous chloride solution of metal cations sprayed sequentially on the surface of a rotating, heated substrate.

In reference to FIG. 1A spin spray system 100 is a closed reaction chamber like system including at least three nebulizers. Nebulizer 101 is for spraying ferrite or other metal reaction solutions 119, nebulizer 103 is for injection of N2 gas into the chamber, and nebulizer 105 is for spraying oxidation solutions 117. Enclosed inside the reaction chamber is substrate spinning table system 111 for supporting, heating, and spinning substrate piece 109. Spray mist fogs 119 and 117 are designed to cover the entire supporting table 111, and in the alternative, multiple nebulizers maybe installed to render uniform depositions, and multiple substrate pieces may be placed on the substrate spinning table at the same time. Unreacted excessive solutions sprayed upon the substrate(s) are spun off the substrates and exit the table through drain outlet 113 and 115. Support Table 111 is configured with substrate supporting top panel 110 with a temperature-controlling heating facility which is mounted on a rotation spindle 112 with a motor which rotates supporting panel 110.

Figure 1B:
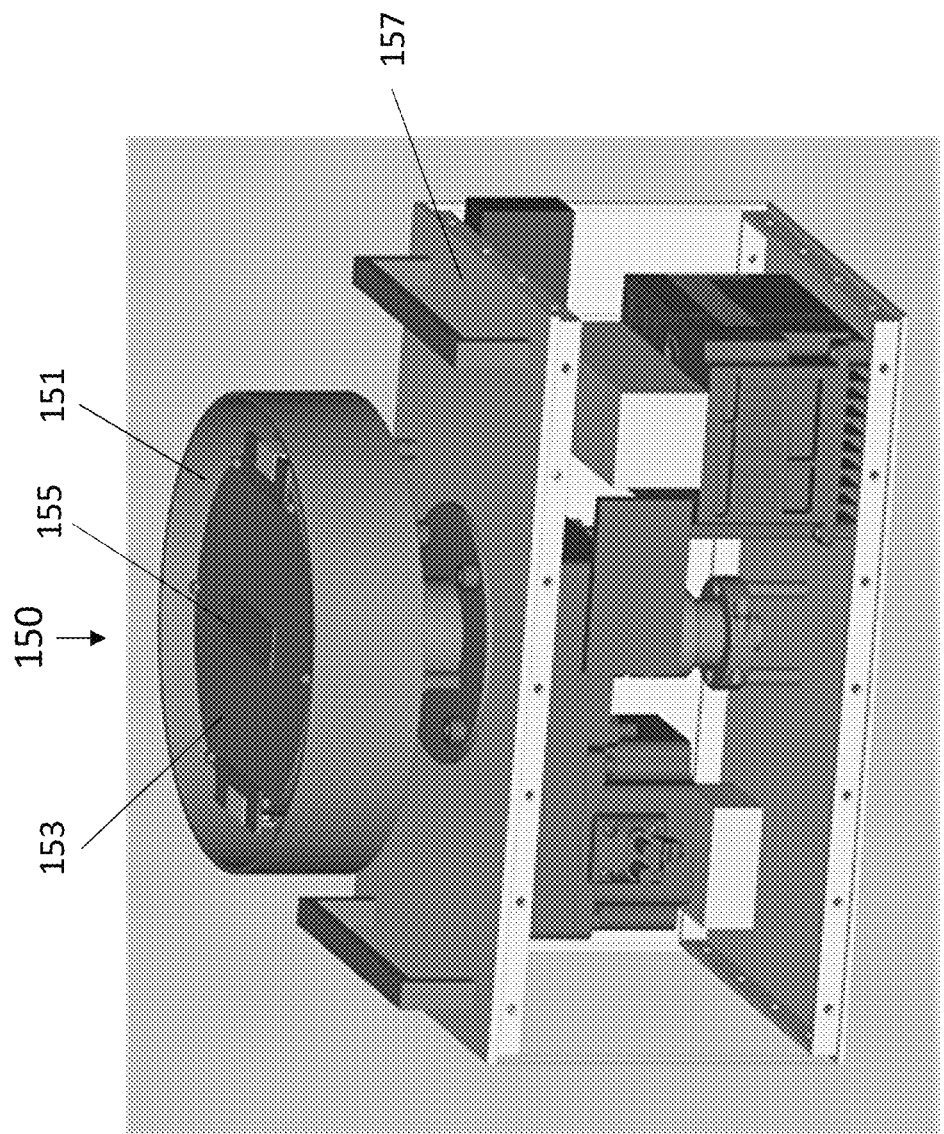
FIG. 1B is an example spin-spray deposition rotation machine system in according to an illustrative embodiment of the invention.

An example spinning table machine system 150 is shown in FIG. 1B. Preferably the substrate supporting panel 153 is placed inside a round cylinder chamber or container structure 151 which would collect spun off solutions from panel 153. Preferably substrate supporting panel 153 is a circular disc of 24" diameter. Other shapes maybe be adopted as well. External cylinder chamber 151 is fixedly mounted to support column 160 that remains motionless while substrate supporting panel 153 is mounted to a rotation spindle contained inside column 160. A heating facility is coupled with panel 153 so that panel 153 would be uniformly heated. Panel 153 may be made of metal or other heat conducive material while cylinder chamber structure 151 may be made of heat insulating material. Alternatively, cylinder chamber 151 may be made of other shape or form to function as an excessive solution drain and sealed reaction chamber. When in use, substrate 155 is placed face up on supporting panel 153 to receive sprayed mist of ferrite metal and oxidation solutions while the supporting panel 153 is heated to a specified reaction temperature and rotates at a specified speed. Preferably the rotation speed is around 90 rpm and the temperature is heated around up to 100° C., up to 200° C., or up to 300° C. The spray flow rates of the reactants and the oxidants may be configured between 5 mL/min and 100 mL/min.

Example 1: Use of the Spin-Spray Ferrite Deposition System

A six-liter oxidizing solution containing 0.84 g $NaNO_2$ and 69 g $CH_3COONa$ is prepared and held in a container. Similar, a six-liter cation ferrite solution containing $FeCl_2$ (9.21 g), $ZnCl_2 \cdot 6H_2O$ (0.246 g) and $MnCl_2 \cdot 6H_2O$ (0.867 g) is also prepared and held in a container. Bubbled nitrogen may be used in both containers to prevent premature oxidation of the cations and $NaNO_2$. These solutions were respectively flew through a 0.125" diameter polypropylene tube to the spray nozzles 101 and 105.

To begin a deposition run, FR4 substrates were placed on a plate onto the spin table with a spindle with a carbon tape. After the rpm of spindle were set, and the rotation was initiated. Preferably the rotational speeds were operated in the range of about 40 rpm to about 300 rpm. The substrate surface is then heated to a specified temperature, and it rotates on the spindle, and it is exposed to alternating sprays of oxidizer and cation solutions. Spacing between nozzles and distance between the bottom of the nozzle and the substrate surface are part of the testing parameters. Preferably, the nozzles are placed directly over substrates, and the distance between nozzles and the surface of substrates is preferably in the range of about 1 inch to about 5 inches. Typically, the deposition time for an approximately 3 μm thick ferrite film at 90 rpm rotation speed is about 180 minutes.

Figure 2:
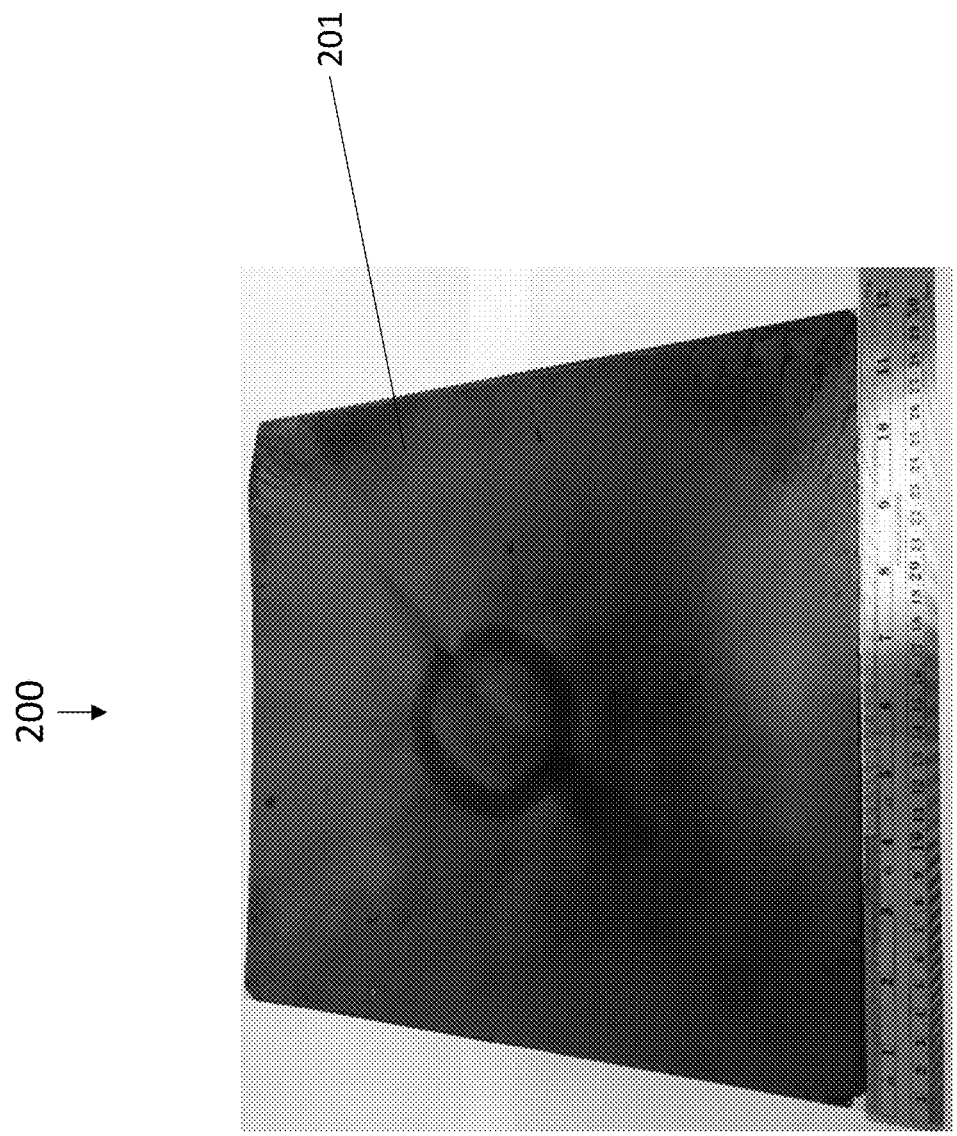
FIG. 2 is an optical microscope image of 3 μm MnZn Ferrite deposit film on a 12 inch by 12 inch 100 μm thick square RF4 substrate.
Figure 3A:
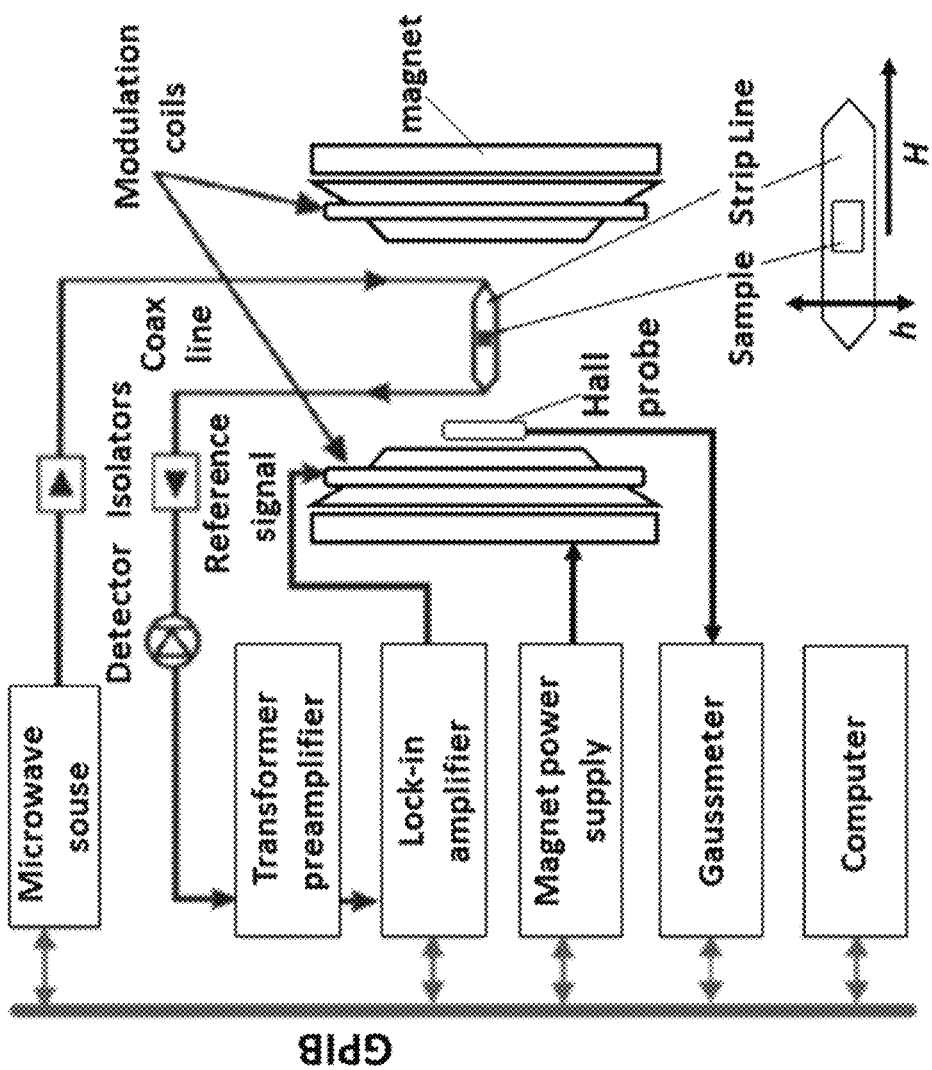
FIG. 3A is a schematic of the stripeline ferromagnetic resonance spectrometer for measuring ferromagnetic resonance. The sample is placed directly above the stripeline. The direction of applied static field H and microwave field h are as indicated in the inset.
Figure 3B:
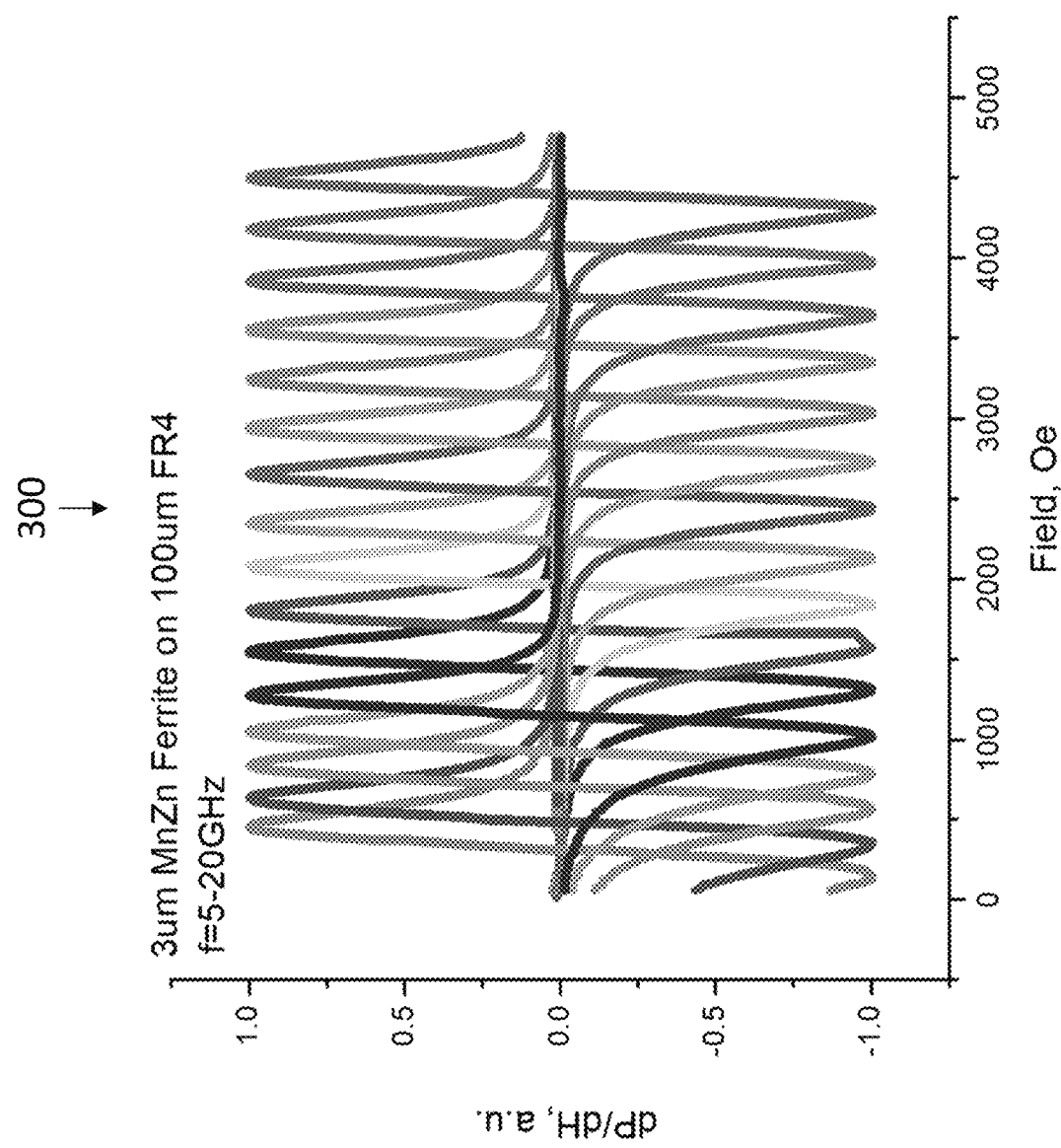
FIG. 3B is the ferromagnetic resonance (FMR) of the 3 μm MnZn ferrite film on the 100 μm thick FR4 substrates in FIG. 2.
Figure 3C:
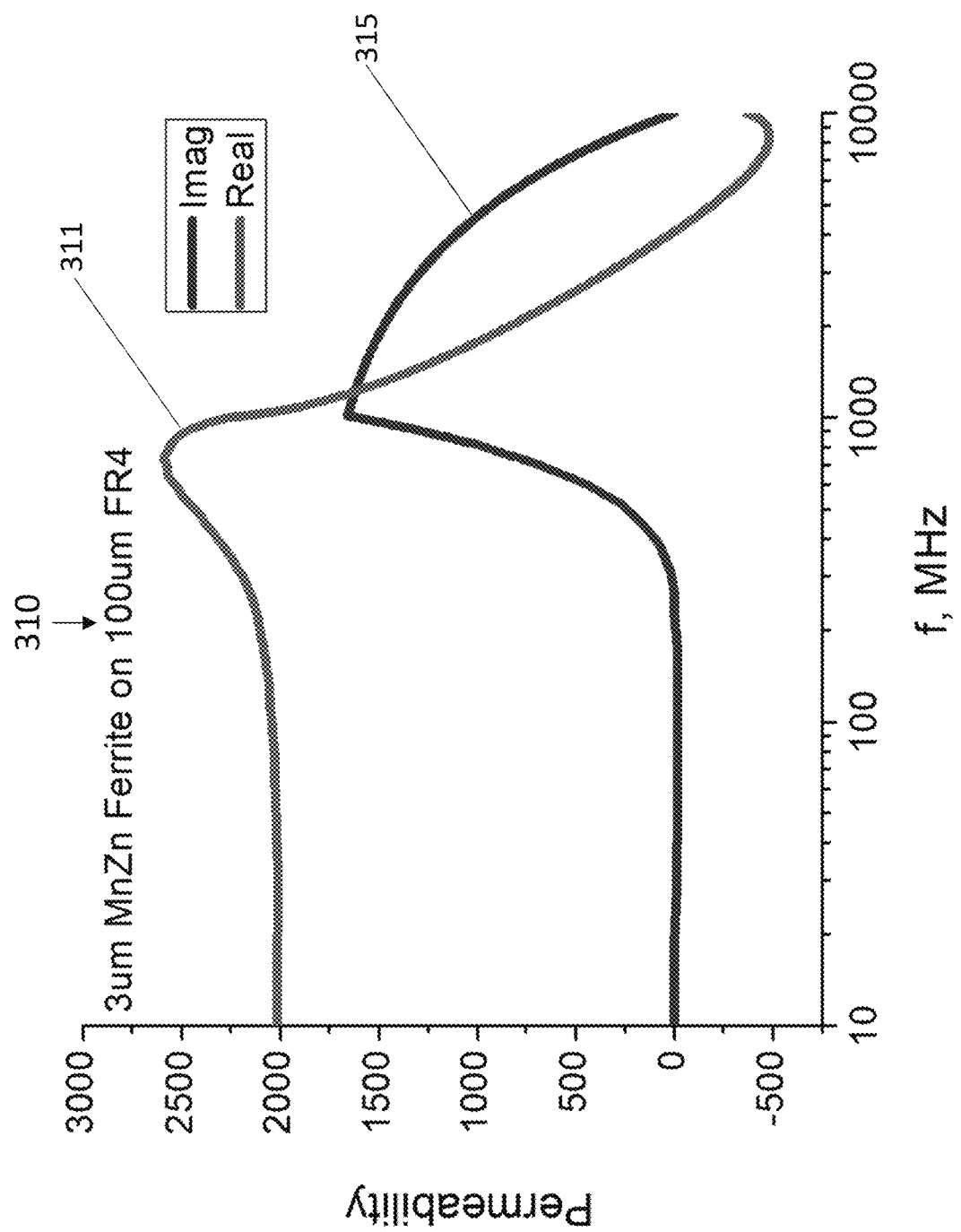
FIG. 3C is the real permeability of the 3 μm MnZn ferrite film on FR4 substrate of FIG. 2, showing a high saturation magnetization greater than 0.8 T and high real permeability larger than 2000.

Typically, a higher rpm yields better quality films, for instance it may increase the smoothness of the formed ferrite film. After metal-ferrite film formation, the substrate panel is covered with a blackish-gray layer of ferrite material. FIG. 2 shows the photo image of an example 3 μm MnZn Ferrite coated on 100 μm thick 12 inches by 12 inches FR4 substrate. The white or transparent uncoated FR4 is now in a blackish-gray color. The dark spots may be due to thicker deposition of the MnZn Ferrite. This deposited 3 μm MnZn Ferrite shows a high level saturation magnetization that was greater than 0.8 T and a high permeability that was larger than 2000 as shown in FIGS. 3A and 3B.

This spin spray methods are capable of depositing MnxZn(1-x)-ferrite, where x is the ratio between Mn and Zn, films with an ultra-high relative permeability if different amount of $MnCl_2$ and $ZnCl_2$ are used in the cation ferrite solution. For example, a relative permeability of greater than 2000 and high saturation magnetic flux density Bs=0.85 Tesla may be obtained at 50/50 ratio of Mn0.5Zn0.5-ferrite composition. The spin spray reaction solutions may be composed of a chemical formula of $FeCl_2$ and $MCl_2$, where M is a metal ion like Zn, Co, Mn, Ni, or other metal ions, or the mixture of them, while the oxidizing solution is a mixture of a oxidant buffer, such as an acetate, $CH_3COONa$, $CH_3COOK$, $CH_3COONH_4$ and an oxidant, such as $NaNO_2$. The deposition reaction temperature preferably ranges between 70-120° C., and the speed of rotation of the supporting table at between 120-200 rpm for high quality films. The heating temperature, speed and rotation may be adjusted for optimum reaction and deposition results.

Figure 5:
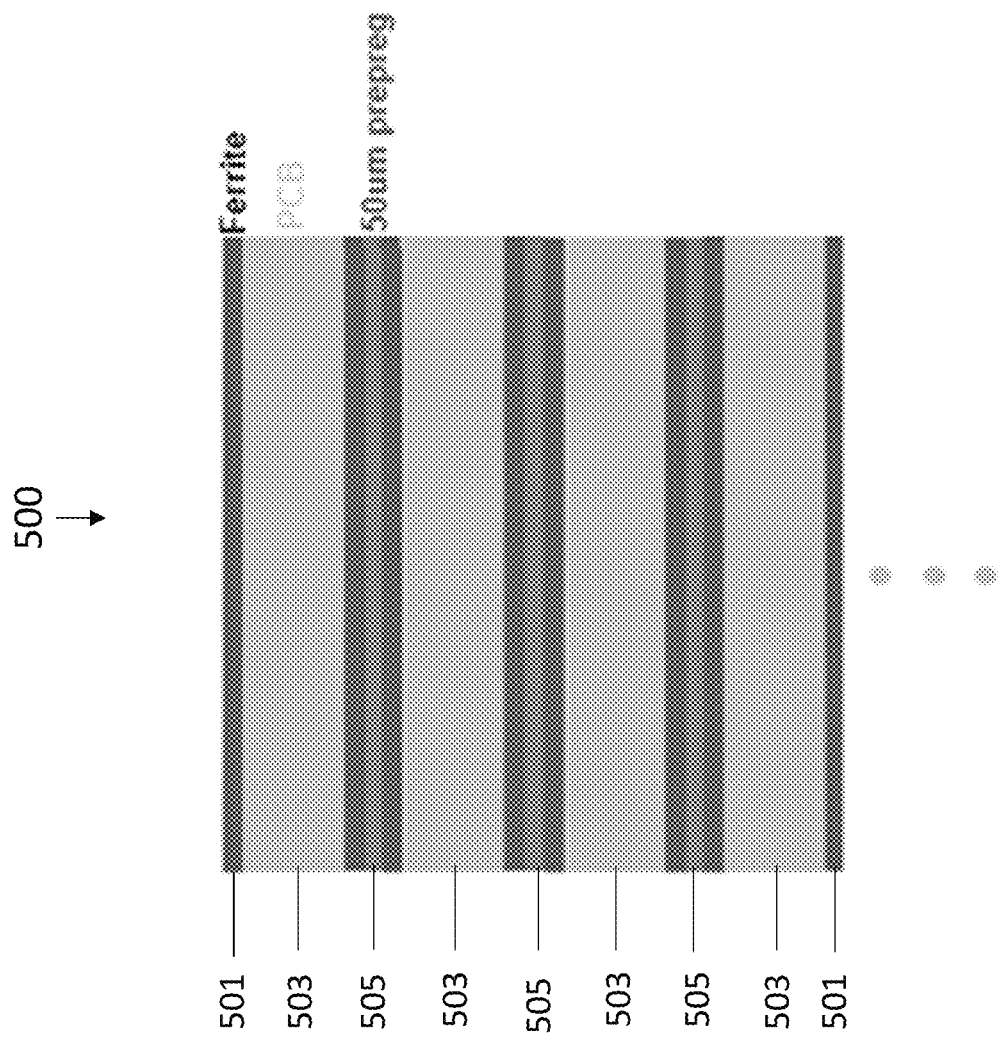
FIG. 5 is a schematic of a magnetic PCB laminate with multiple layers of 3 μm MnZn-ferrite/100 μm FR4/3 μm MnZn-ferrite laminated together with epoxy glue through hot-pressing in accordance with this application.

In reference to FIG. 5, a thicker film ferrite laminate 500 is fabricated by forming a layered assembly including two or more coated substrates, each coated substrate having a ferrite thin film, and heating the layered assembly to form the thick film ferrite laminate. In the diagram, a multilayer layered ferrite laminate structure 500 schematically comprises of a top layer of ferrite 501, middle layer PCB substrate 503, bottom layer of 501 which is glued by 50 μm of prepreg to another layer comprising ferrite coating 501, middle layer PCB substrate 503, bottom layer 501. This a four layered assembly may be formed by stacking two or more coated ferrite substrates, one on top of another as shown in FIG. 5, 503 represents a substrate and 501 represents a ferrite coat while 505 represents a thermos plastic resin or prepreg glue.

Alternatively coated substrates may be first formed by depositing ferrite on a larger substrate and cutting the larger coated substrate into several smaller ferrite coated pieces and to stack the smaller pieces together. A large substrate may be, for example 12 inch by 12 inch as shown in FIG. 2. In other cases, layers of ferrite coated substrates may be formed individually. The ferrite coated substrates used to form a layered laminate assembly may have substantially uniform dimensions, or they may not be the same. The surface areas, shapes and thicknesses of the substrates can vary and can be stacked together. In one example, a circular substrate has a diameter between 1 inch and 24 inches may be used. In another example, a substrate is square with a size of 1 ft by 1 ft. The thickness of the coated ferrite may vary in a range between 0.1 μm and 10 μm.

Figure 6B:
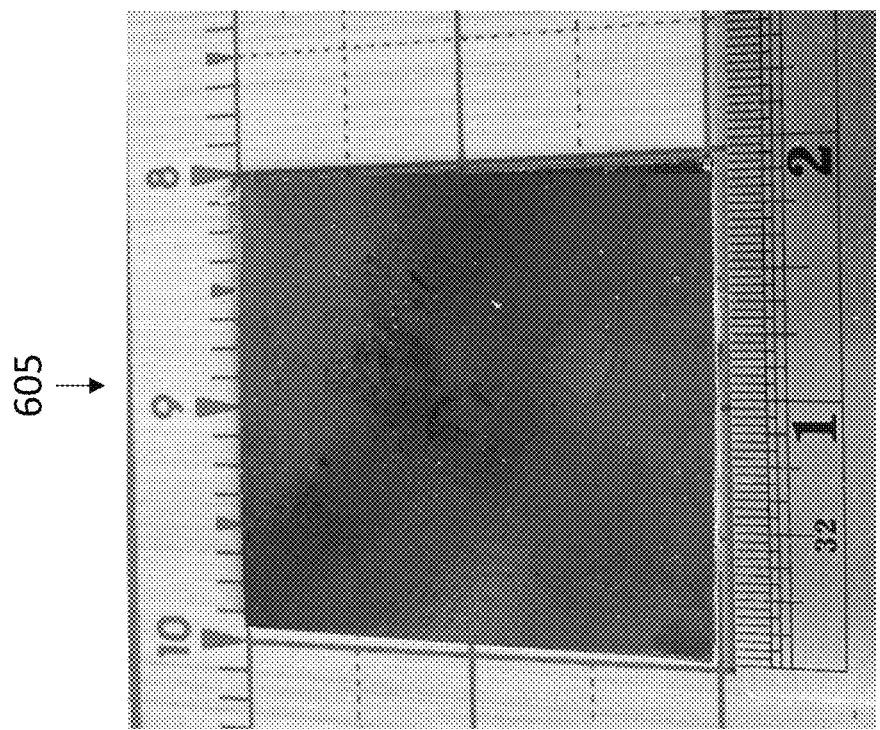
FIG. 6B is an optical microscope image of an example 2 inch by 2 inch of 1.3 mm thickness form by 8 layers of 3 μm MnZn-ferrite/100 μm FR4/3 μm MnZn-ferrite laminated with 50 μm prepreg through hot-pressing.
Figure 6A:
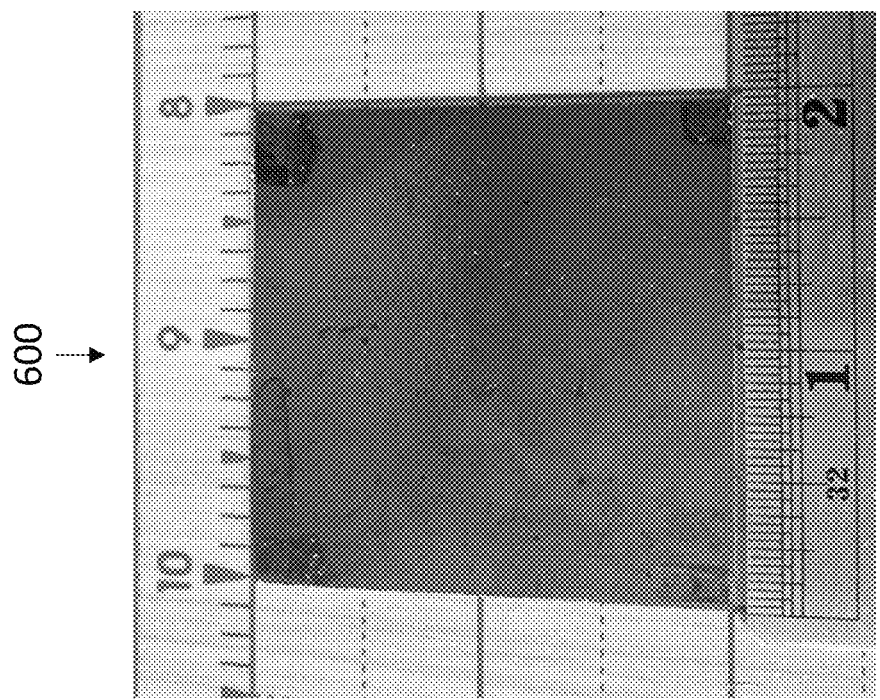
FIG. 6A is an optical microscope image of an example 2 inch by 2 inch of 0.65 mm thickness formed by 4 layers of 3 μm MnZn-ferrite/100 μm FR4/3 μm MnZn-ferrite laminated with 50 μm prepreg through hot-pressing.

In some cases, the ferrite layer of a coated substrate may be first cleaned before they are used to form an assembly. The number of coated layers can very, for example, at least 2 and less than 100, and there are stacked tightly together to form a layered assembly in a manner such that the ferrite layer of one coated substrate is in directly pre-preged with the uncoated substrate surface of another coated substrate. FIGS. 6A and 6B show two examples of a laminate with layers of 3 μm MnZn-ferrite/100 μm FR4/3 μm MnZn-ferrite attached with epoxy glue through hot-pressing.

Compressing the layered assembly may include positioning the layered assembly in a press and applying pressure to the layered assembly, forcing the coated substrates together. The pressure applied on the surface of the substrate may vary between 0.65 psi to 3.5 psi.

After a layer assembly is assembled in a press, the press is then heated to a temperature less than the transition temperature of one or more of the substrates in the layered assembly. The layered assembly may be heated at a ramp rate between 2° C./min and 30° C./min. In one example, a layered assembly is heated to a temperature between 120° C. to 250° C. After achieving the desired temperature, the layered assembly may continue to be heated for at least 30 mins or at least 1 hour. In some cases, the layered assembly is heated up to 3 hours or more. In certain cases, the layered assembly is heated for a specified desired time, the annealed layered assembly is left to cool down without disturbance.

Figure 4:
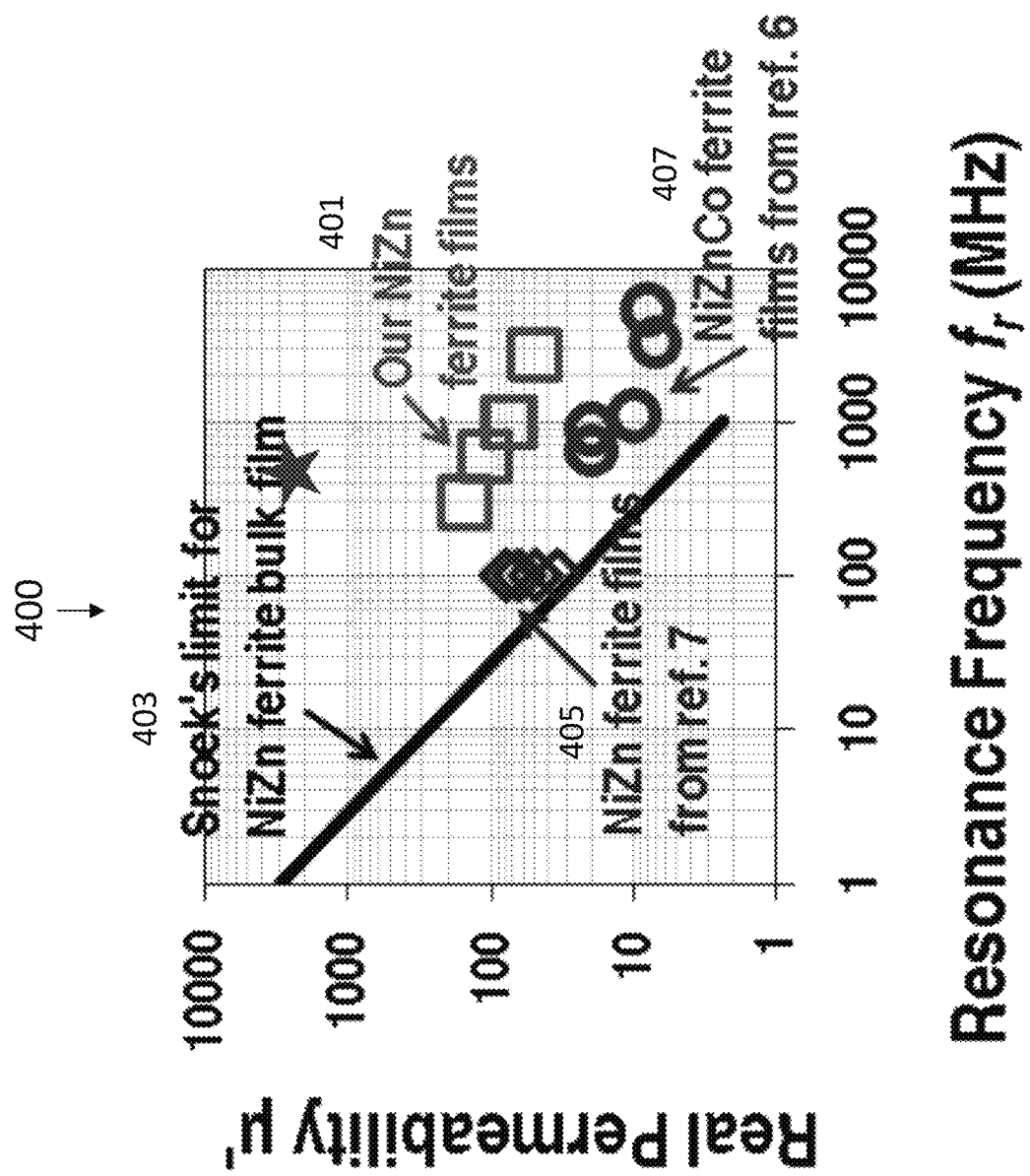
FIG. 4 is a measurement of real permeability of other referenced magnetic ferrite films on PCBs and Si in comparison to the 3 μm MnZn Ferrite films on FR4 of FIG. 2 that shows a real permeability of 2000.

Advantages of spin-spray ferrite deposition and the magnetic PCBs assembly methods described herein include providing high permeability thick PCBs (0.5~2 mm thick PCBs) with multilayered ferrite films, generating thick high permeability PCBs with a relative permeability μr>100 at>300 MHz. FIG. 4 shows a graph 400 of real permeability vs. resonance frequency. This graph compares the measured real permeability data of the spin-spray ferrite coated magnetic PCB in this application with other integrated RF thick magnetic ferrite films on PCB and Si substrates by published methods. 409 is the data point of the spin-spray MnZn ferrite coated PCB shown in FIG. 2, 401 refers to the data points of spin-spray NiZn ferrite filmed PCBs while 403 refers to Snoek's limit for NiZn ferrite bulk film, 405 refers to the data points of NiZn ferrite films of a publication and 407 refers to NiZnCo ferrite films of another publication. It is quite obvious that currently there are no other methods in the market that generate magnetic PCBs with as high a permeability as those generated by the spin-spray deposition method described in this application. The magnetic PCB applications may include inductors, antennas, and magnetic sensors. Advantages of the thin film ferrite laminates formed as described herein also include low cost, large-scale in size, high permeability.

Example 2: Ferromagnetic Resonance (FMR) Spectroscopy Measurement

FMR is coupling between an electromagnetic wave and the magnetization of a medium through which the electromagnetic wave passes. This coupling induces a significant loss of power of the wave. The power is absorbed by the precessing magnetization of the material and lost as heat. For this coupling to occur, the frequency of the incident wave must be equal to the precession frequency of the magnetization (Larmor frequency) and the polarization of the wave must match the orientation of the magnetization.

The Ferromagnetic Resonance (FMR) Spectroscopy is a key technique used to measure the ferromagnetic resonance (FMR) line width for metallic magnetic thin film samples. The typical working frequency of FMR system is 1 GHz to 10 GHz or higher. FIG. 3A schematically shows an inventor-made stripline FMR spectrometer system. The non-resonant stripline can help the system to overcome bandwidth restrictions for broad band operation. During the measurement, electromagnetic is controlled through software and the applied static magnetic field varies from 0 Oe to a maximum of 5~10 kOe. Samples are mounted directly on to the stripline to make sure the microwave field is uniform over sample area. The microwave frequency that is fed into stripline will remain the same during each measurement cycle. Then the FMR absorption profile can be obtained through field modulation method and a lock-in amplifier. The experimental FMR absorption versus magnetic field curve is usually symmetric. Linewidth can be determined through full width half maximum of the response.

FMR arises from the precessional motion of the (usually quite large) magnetization M of a ferromagnetic material in an external magnetic field H. The magnetic field exerts a torque on the sample magnetization which causes the magnetic moments in the sample to precess. Ferromagnetic resonance (FMR) is a useful technique in the measurement of magnetic properties of variety of magnetic media from bulk ferromagnetic materials to nano-scale magnetic thin films. The precessional motion of a magnetization of a ferromagnetic material in relation to the applied external magnetic field is known as the FMR. In the actual process of resonance from macroscopic point of view, the energy is absorbed from rf transverse magnetic field hrf, which occurred when frequency matched with precessional frequency. Microscopically, the applied field forces a Zeeman splitting in the energy levels, and the microwave excites magnetic dipole transitions between these split levels. The precession frequency depends on the orientation of the material and the magnitude of the applied magnetic field. It has the capability to measure all the most important parameters of the magnetic material i.e., static properties: curie temperature, total magnetic moment, relaxation mechanism, elementary excitations; and the dynamic properties. The dynamic properties of magnetic materials can be feasibly perplexed by FMR, by excitation of standing spin waves due to magnetic pinning.

FMR is usually measured at microwave frequencies (from a few GHz up to about 100 GHz) and the applied magnetic fields range from 0 up to a few T. Testing samples are placed in FMR spectrometer. The microwave power is supplied by klystron or other microwave generator. The power reflected from the device under test (DUT) containing the sample is measured by microwave detector. DUT can be microwave cavity, short-ended waveguide or other microwave device.

In-plane FMR measurements were performed in a JEOL, JES-FA 300 (X-band at ω=8.969 GHz with the power 1 mW) spectrometer at room temperature. As shown in FIG. 3A for the FMR setup. The electromagnet produces the static in-plane magnetic field. A cylindrical cavity resonator is placed at the center of the electromagnet. The microwave unit connected with the cavity resonator by waveguide generates microwave (the rf magnetic field is normal to the FM/FE films) and detects the reflection. As for the influence of the current, no current was injected into the ferromagnetic layer in the experiment. The leakage current during the measurements is below nA, which is much smaller than any other relevant effect in the system and also ways below the required current density for a current induced torque acting on the magnetization.

FMR spectrum under a series of magnetic fields are then converted into magnetic permeability μ (Greek mu) that is thus defined as μ=B/H. Magnetic flux density B is a measure of the actual magnetic field within a material considered as a concentration of magnetic field lines, or flux, per unit cross-sectional area, in an external magnetic field H.

Example 3: Four and Eight Layered Ferrite Filmed PCB Assemblies

3 μm MnZn Ferrite thin film was deposited on a 100 μm thick FR4 substrate at 90° C.-120° C. by inventor's homemade 24 inch-diameter spin spray system as shown in FIG. 1B. After deposition, the ferrite was washed thoroughly with deionized water. The layered substrate was cut into 2"×2" squares, and 4 of the 2"×2" squares were stacked with 50 μm prepreg and formed four layered assembly. The layered assembly was placed in a pressure of 0.65 psi, and at the same time the layer assembly was heated at 120° C. for 30 mins. After heating, the laminate was cooled down under pressure of 0.65 psi. In FIG. 6A, 600 is an optical microscopy image of a 2"×2"×0.025" four layered laminate constructed of Mn—Zn ferrite deposited on to a FR4 substrate using a spin spray process.

Two four-layered ferrite filmed PCB assemblies were stacked 50 μm prepreg together and formed 8 layered ferrite filmed PCB assembly. In FIG. 6B, 605 is an optical microscopy image of a 2"×2"×0.05" 8 layered laminate constructed of Mn—Zn ferrite deposited on to a FR4 substrate using a spin spray process.

Example 4: NiZn Ferrite Thin Filmed TMM10i PCB

Using $FeCl_2$ (9.21 g), $ZnCl_2 \cdot 6H_2O$ (0.246 g) and $NiCl_2 \cdot 6H_2O$ (1.638 g) as ferrite solution and the process described in Example 1, 10 μm NiZn ferrite thin film was deposited on a TMM10i substrate at 90° C. by spin spray as described in Example 1. After deposition, the ferrite was washed thoroughly with deionized water.

Example 5: Multi-Layered MnZn and NiZn Ferrite Filmed PCB Assemblies

The experiments in Examples 3 and 4 were repeated by busing Ni—Zn ferrite and Mn—Zn Ferrite. Briefly varying number of layers of Ni—Zn ferrite filmed PCBs or Mn—Zn ferrite filmed PCBs were hot-pressured together with 50 μm pre-preg resulting with laminates thickness ranging from about 100 μm to about 10 mm. The laminated Ferrite Filmed PCB Assemblies were further measured for the real permeability.

Figure 7A:
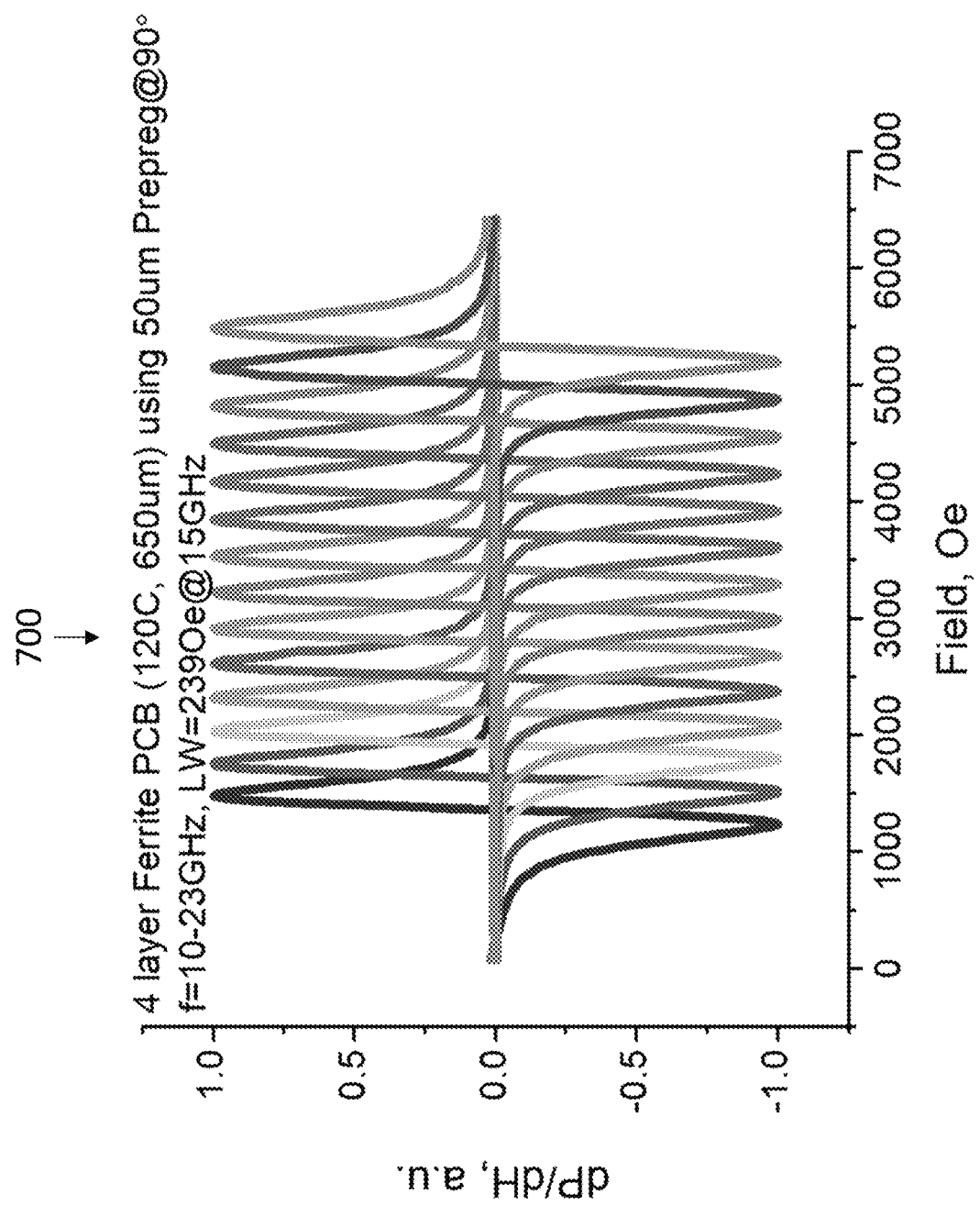
FIG. 7A is the FMR of the 0.65 mm thick magnetic laminate material formed by 4 layers of 3 μm MnZn-ferrite/100 μm FR4/3 μm MnZn-ferrite attached with a thin layer of 50 μm prepreg hot-pressed at 90° C.
Figure 7B:
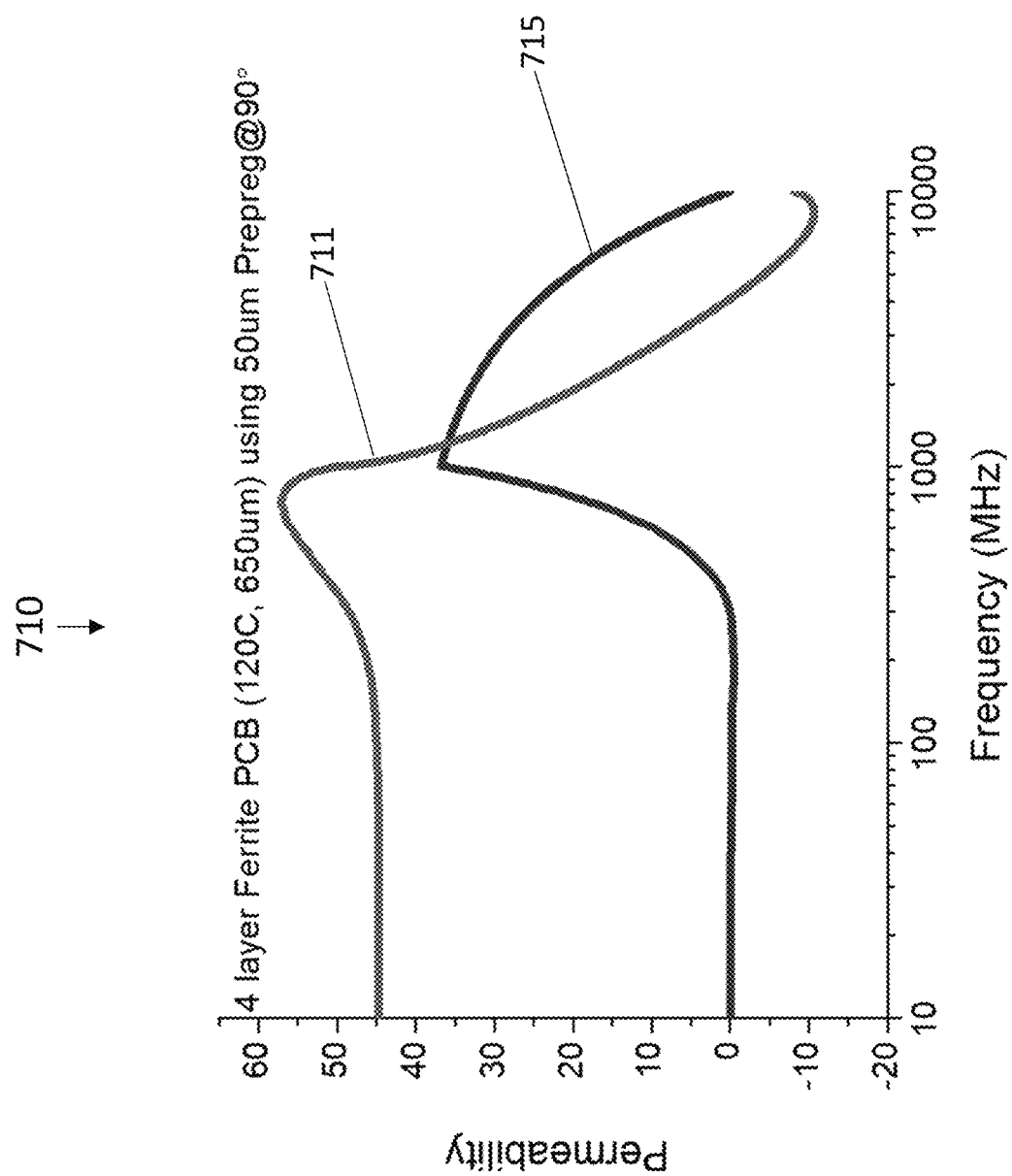
FIG. 7B is the permeability of the 0.65 mm magnetic laminate material of FIG. 7A showing a permeability of 45.

FIG. 7A shows the FMR spectrum 700 generated at external microwave frequency scan 10-23 GHz of the 4 layer PCB laminate of FIG. 6A of 0.65 mm magnetic laminate of 3 μm MnZn-ferrite/100 μm FR4/3 μm MnZn-ferrite (deposited at 120° C.) glued with a thin layer of 50 μm prepreg hot-pressed at 90° C. FIG. 7B shows the calculated real permeability and imaginary permeability graph 710 from the results of FIG. 7A. 711 is the real permeability, which shows a value of 45 in frequencies ranges of 10-800 MHz for this 4 layer 3 μm MnZn-ferrite/100 μm FR4/3 μm MnZn-ferrite laminate. 715 is the calculated corresponding imaginary permeability. The bigger the difference between the real permeability and the imaginary permeability, the less the loss of magnetism. As shown in FIG. 7B, at around 800 MHZ, the magnetism of this ferrite PCB laminate was completely lost.

Figure 8A:
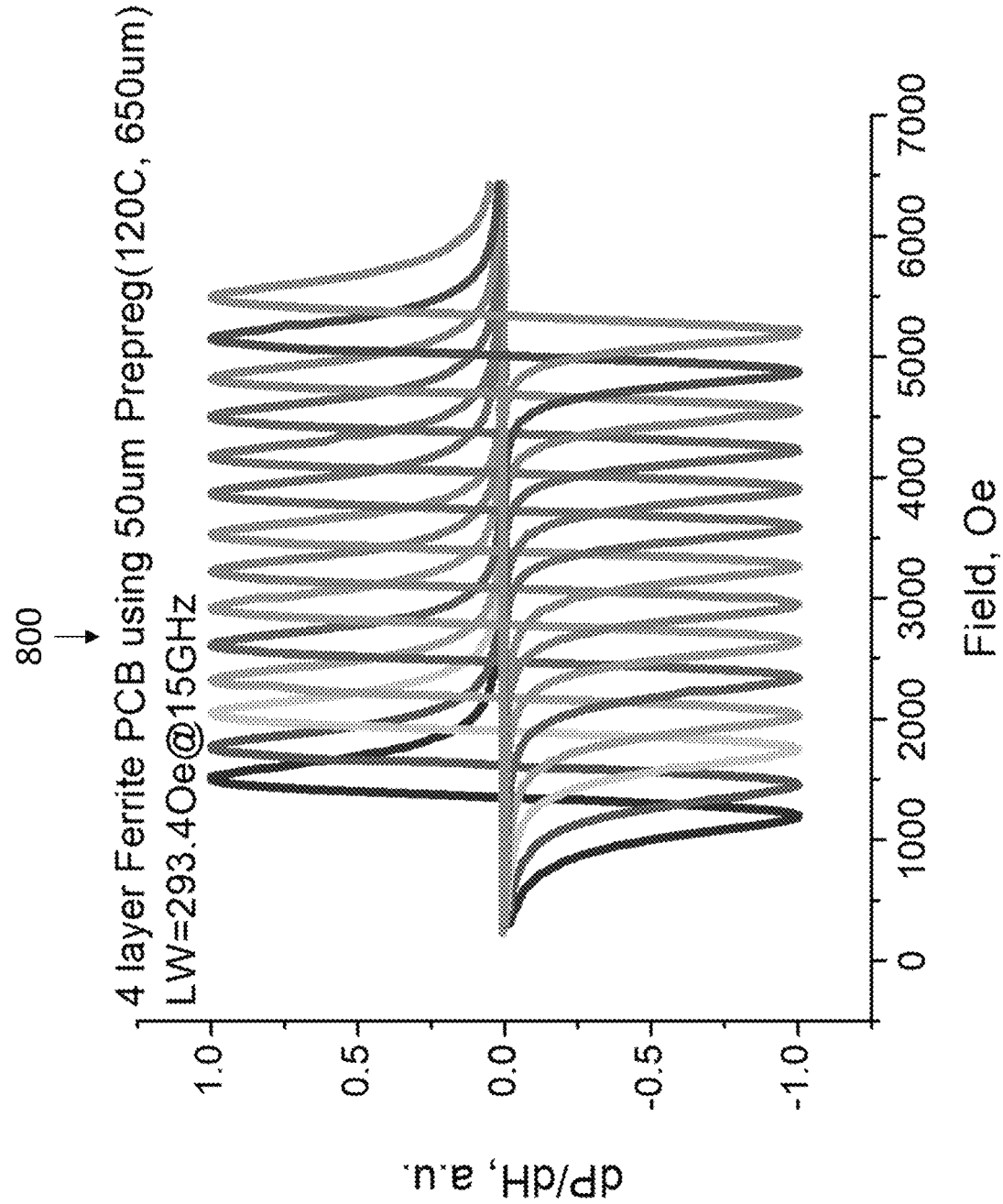
FIG. 8A is the FMR of 0.65 mm magnetic laminate material formed by 4 layers of 3 μm MnZn-ferrite/100 μm FR4/3 μm MnZn-ferrite attached with a thin layer of 50 μm prepreg hot-pressed at 120° C.
Figure 8B:
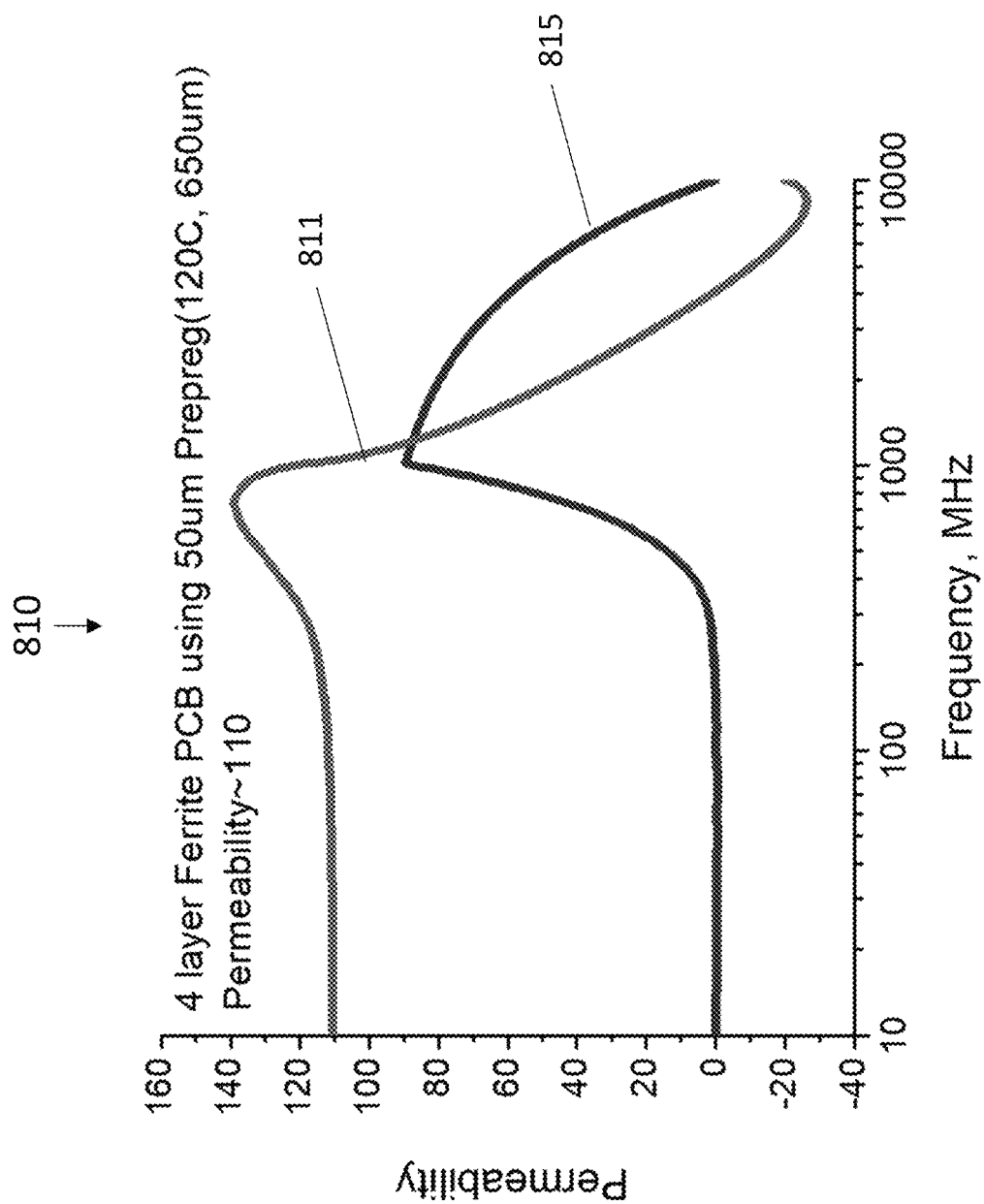
FIG. 8B shows the permeability of 0.65 mm magnetic laminate material of FIG. 8A showing a permeability of 105.

FIG. 8A shows the measurement of the FMRs of a 0.65 mm magnetic PCB laminate of 4 layers of 3 μm MnZn-ferrite/100 μm FR4/3 μm MnZn-ferrite attached with a thin layer of 50 μm prepreg hot-pressed at 120° C. FIG. 8B shows the calculated real permeability and imaginary permeability graph 810 from the results of FIG. 8A. 811 is the real permeability, which shows a value of 110 in frequencies ranges of 10-800 MHZ, a higher value than the one in FIG. 7B. As shown in FIG. 8B, at around 800 MHZ, the magnetism of this ferrite PCB laminate was completely lost.

Figure 9A:
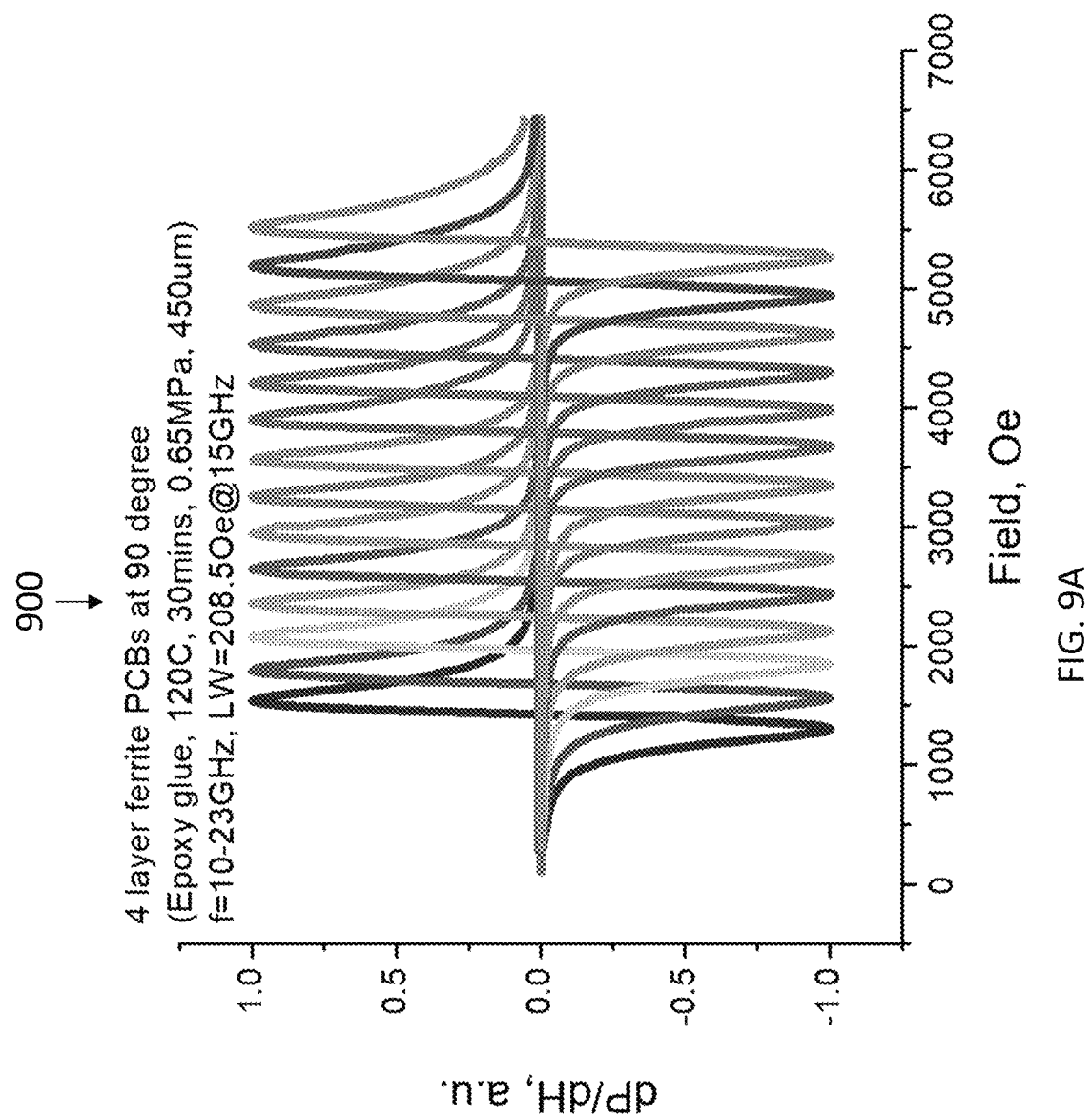
FIG. 9A is the FMR of 0.65 mm magnetic laminate material formed by 4 layers of 3 μm MnZn-ferrite/100 μm FR4/3 μm MnZn-ferrite attached with a thin layer of epoxy glue hot-pressed at 120° C.
Figure 9B:
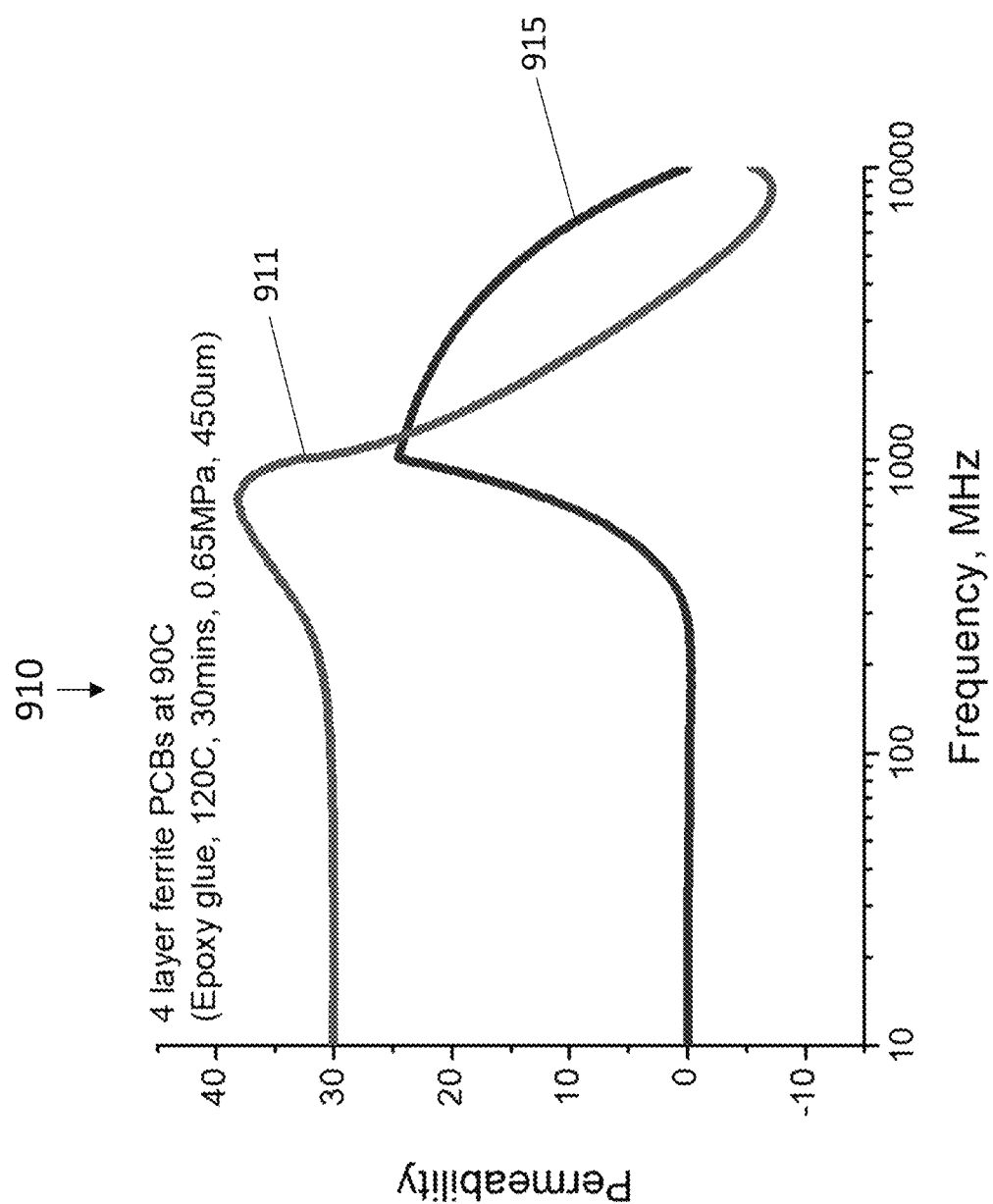
FIG. 9B shows the permeability of 0.65 mm magnetic laminate material of FIG. 9A showing a permeability of 30.

FIG. 9A shows the FMR of a 0.45 mm magnetic laminate formed by hot pressing 4 layers of 3 μm MnZn-ferrite/100 μm FR4/3 μm MnZn-ferrite (spin-spray deposited at 90° C.) attached with a thin layer of epoxy glue at 0.65 MPa at 120° C. for 30 minutes. FIG. 9B shows the calculated real permeability and imaginary permeability graph 910 from the results of FIG. 9A. 911 is the real permeability, which shows a value of 30 in frequencies ranges of 10-800 MHz, a worse value than the one in FIG. 8B. As shown in FIG. 9B, at around 800 MHZ, the magnetism of this ferrite PCB laminate was completely lost.

Figure 10A:
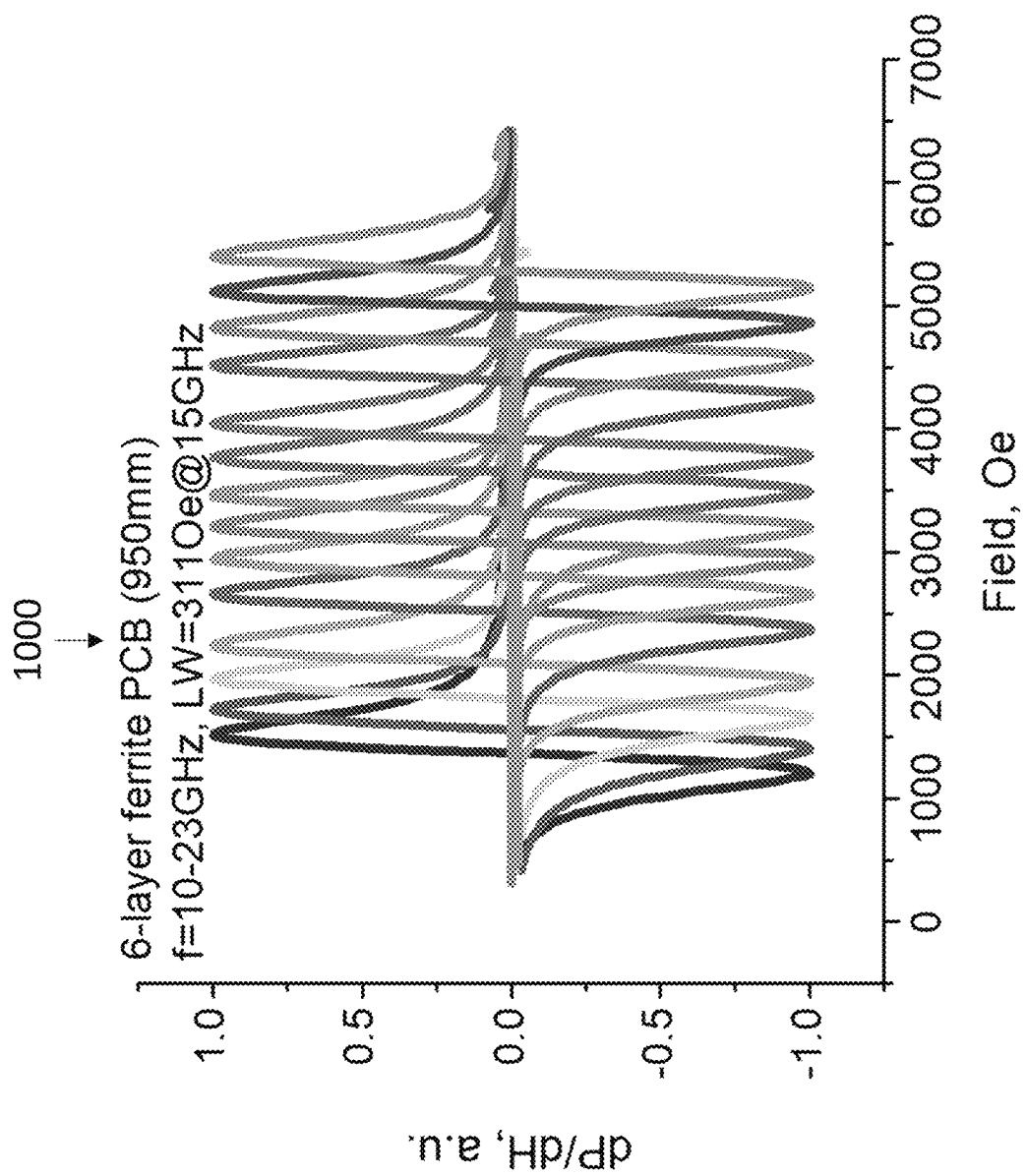
FIG. 10A is the FMR of 0.95 mm magnetic laminate material formed by 6 layers of 3 μm MnZn-ferrite/100 μm FR4/3 μm MnZn-ferrite attached with a thin layer of epoxy glue hot-pressed at 120° C.
Figure 10B:
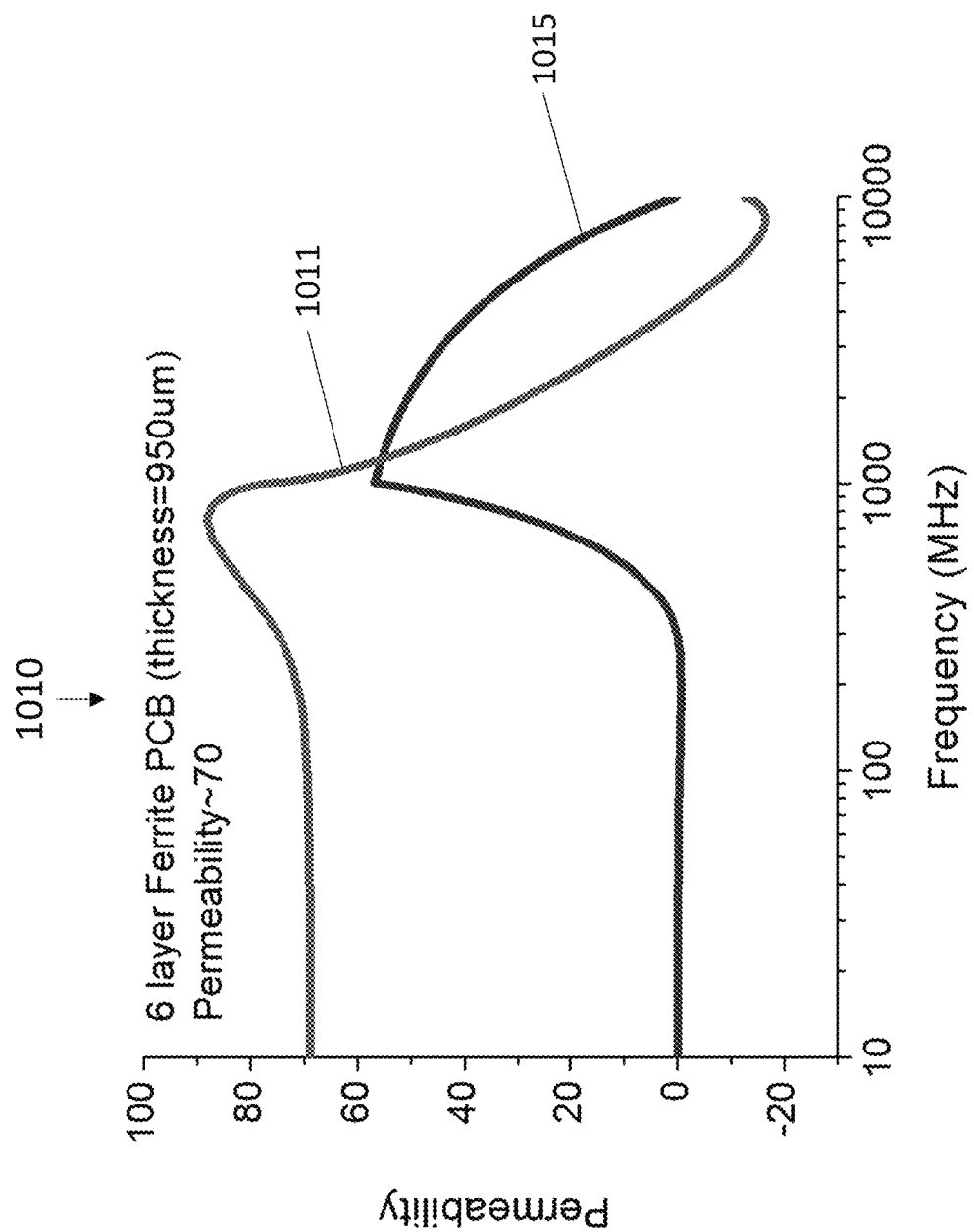
FIG. 10B shows the permeability of 0.95 mm magnetic laminate material of FIG. 10A, showing a permeability of 70.

FIG. 10A shows the FMR of a 0.95 mm magnetic PCB laminate formed by a 6 layers of 3 μm MnZn-ferrite/100 μm FR4/3 μm MnZn-ferrite attached with a thin layer of 50 μm prepreg. FIG. 10B shows the calculated real permeability and imaginary permeability graph 1010 from the results of FIG. 10A. 1011 is the real permeability, which shows a value of 70 in frequencies ranges of 10-800 MHZ, a better value than the one in FIG. 9B. As shown in FIG. 10B, at around 800 MHZ, the magnetism of this ferrite PCB laminate was completely lost.

Figure 11A:
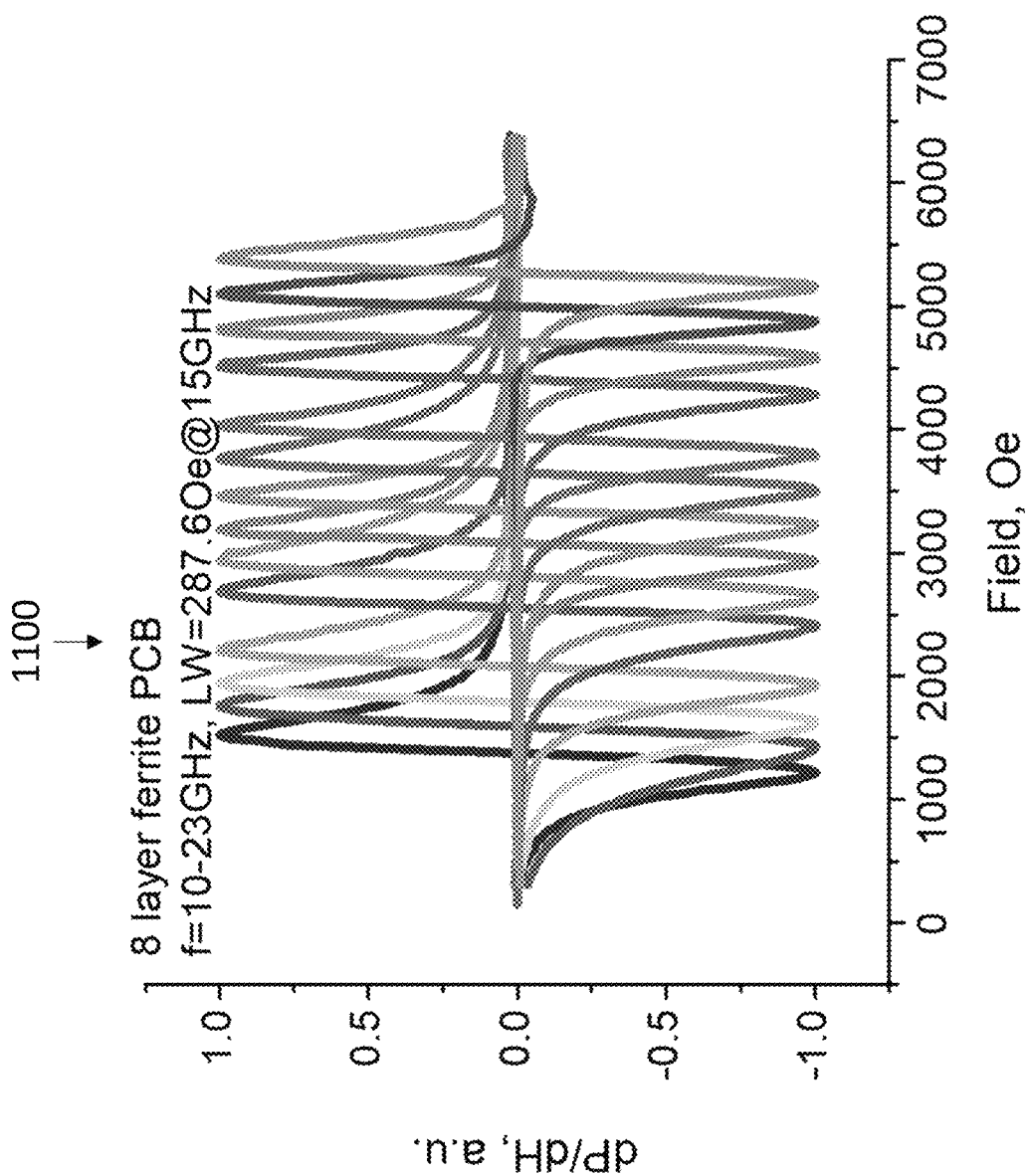
FIG. 11A is the FMR of 1.3 mm magnetic laminate material formed by 8 layers of 3 μm MnZn-ferrite/100 μm FR4/3 μm MnZn-ferrite attached with a thin layer of epoxy glue hot-pressed at 120° C.
Figure 11B:
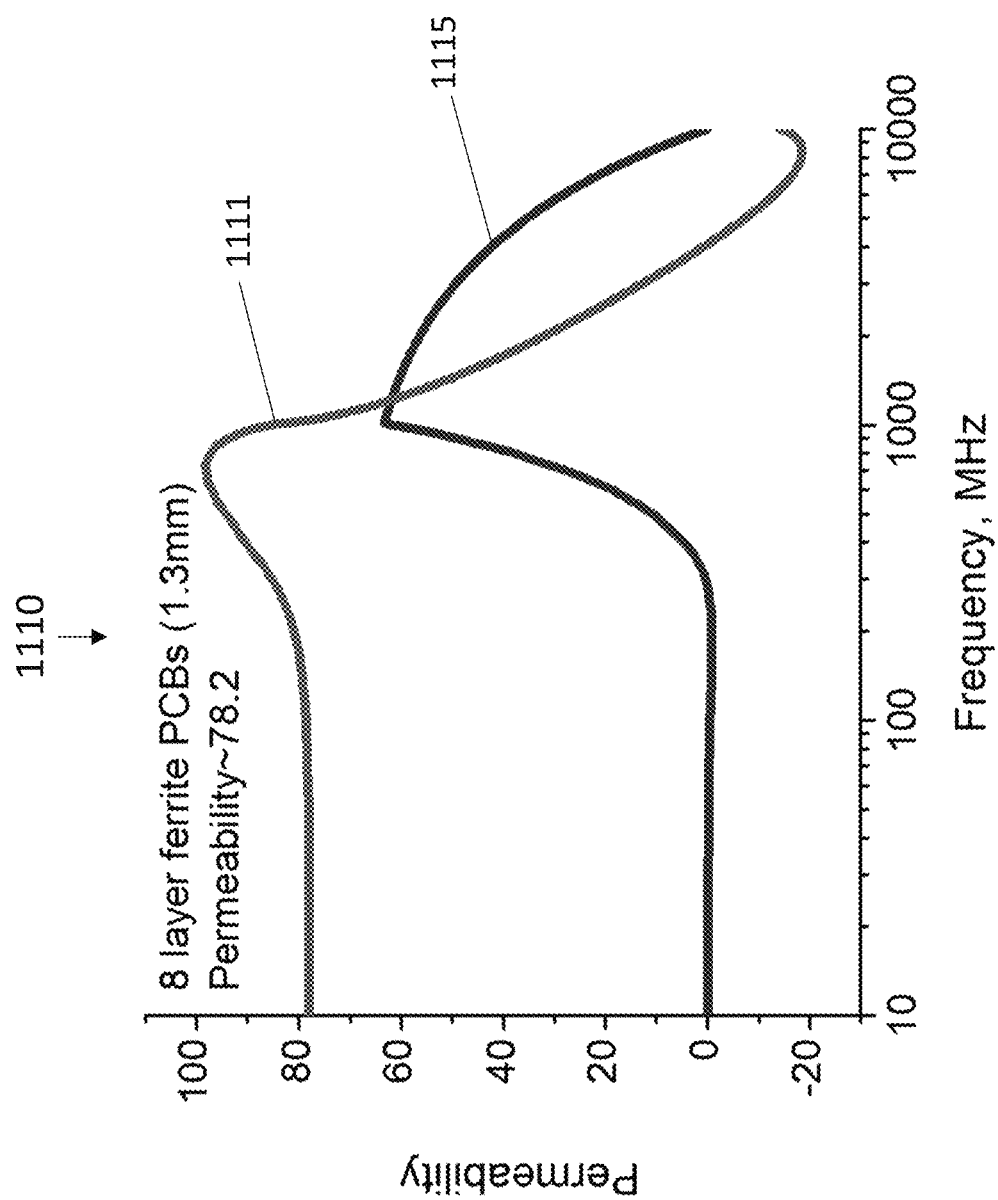
FIG. 11B shows the permeability of 1.3 mm magnetic laminates material of FIG. 11A, showing a permeability of 78.2.

FIG. 11A shows the FMR of a 1.3 mm magnetic PCB laminate formed by 8 layers of 3 μm MnZn-ferrite/100 μm FR4/3 μm MnZn-ferrite attached with a thin layer of 50 μm prepreg. FIG. 11B shows the calculated real permeability and imaginary permeability graph 1110 from the results of FIG. 11A. 1111 is the real permeability, which shows a value of 78.2 in frequencies ranges of 10-800 MHZ, a better value than the one in FIG. 10B. As shown in FIG. 11B, at around 800 MHZ, the magnetism of this ferrite PCB laminate was completely lost.

Figure 12A:
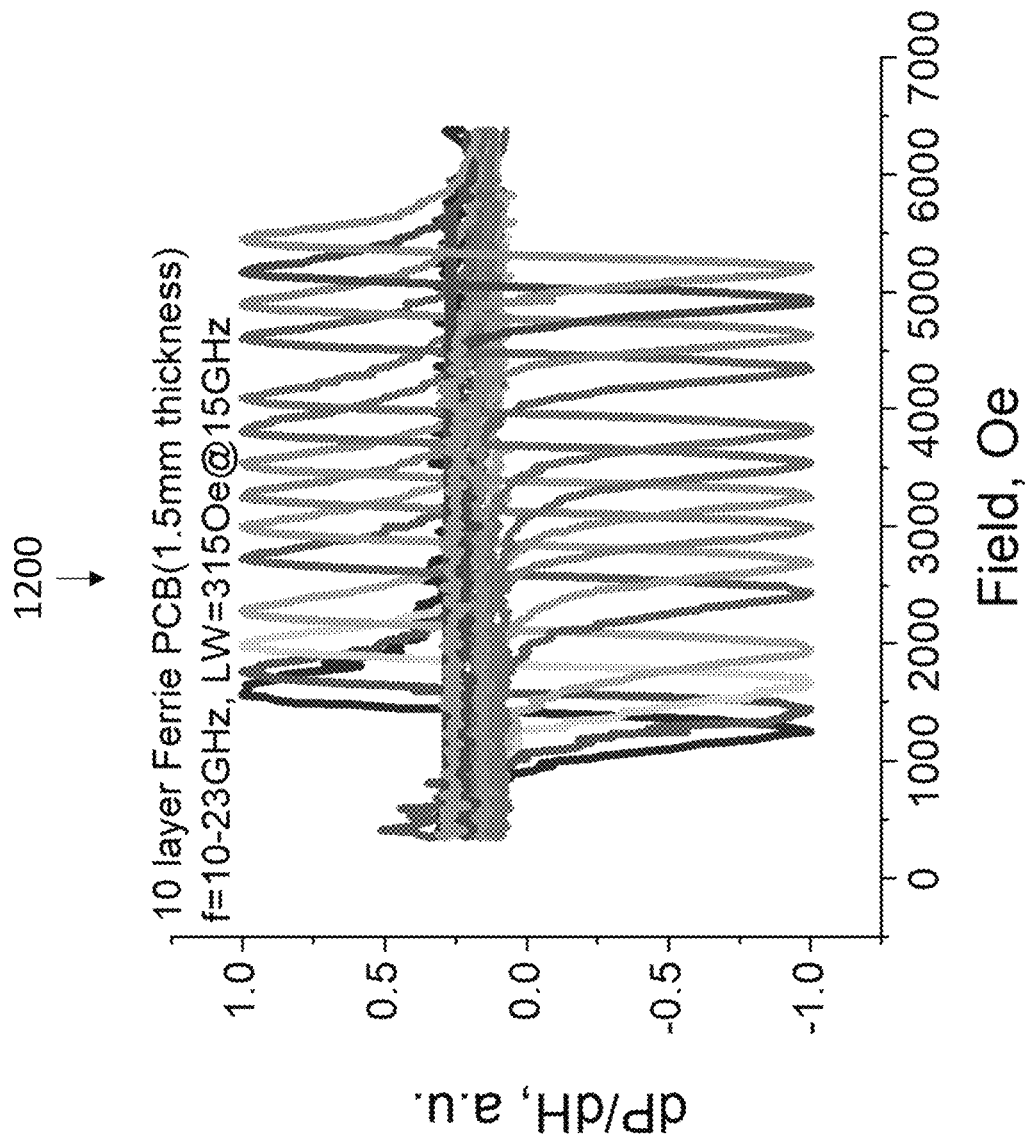
FIG. 12A is the FMR of 1.5 mm magnetic laminate material formed 10 layers of 3 μm MnZn-ferrite/100 μm FR4/3 μm MnZn-ferrite attached with a thin layer of epoxy glue hot-pressed at 120° C.
Figure 12B:
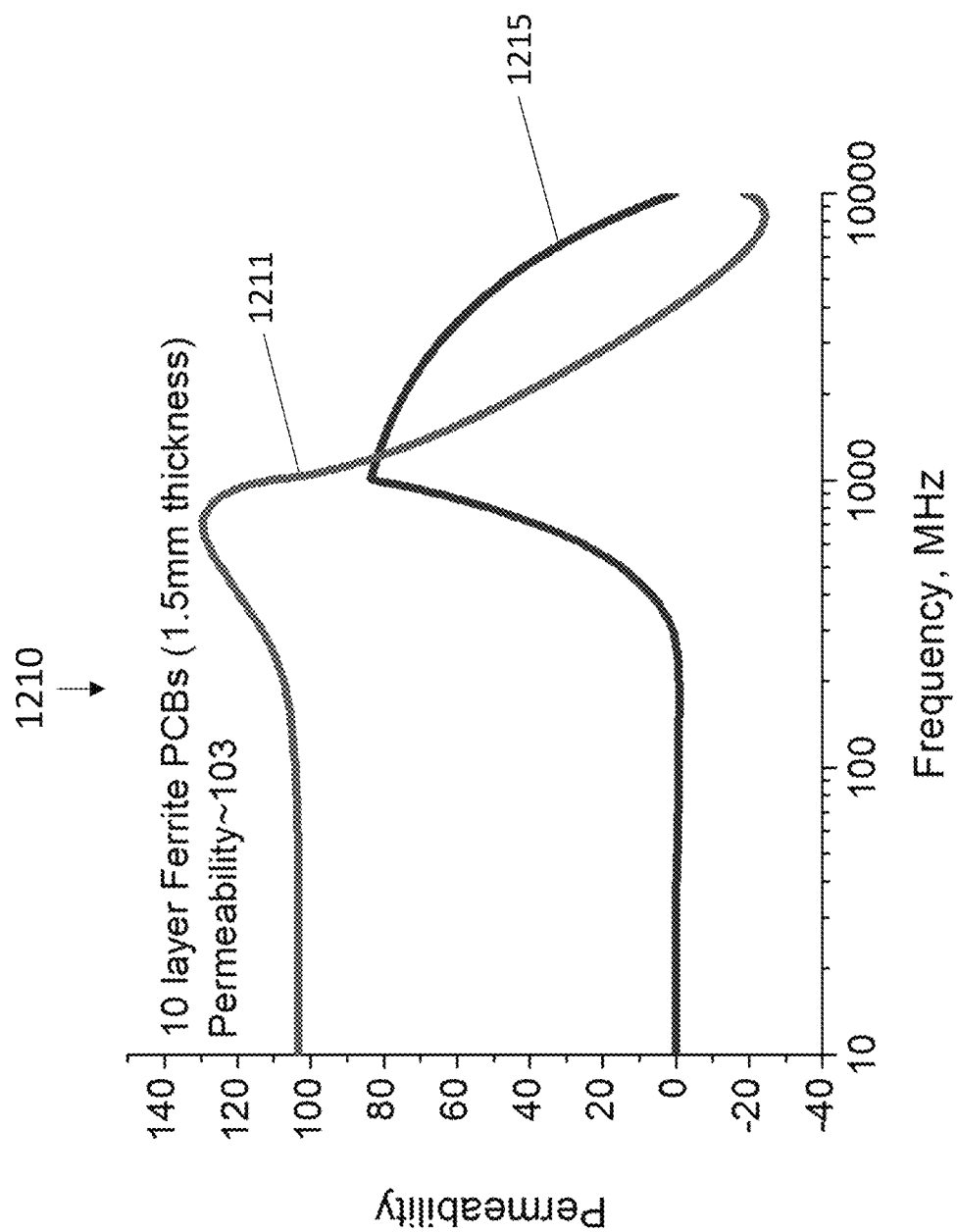
FIG. 12B shows the permeability of 1.5 mm magnetic laminates material of FIG. 12A, showing a permeability of 103.

FIG. 12A shows the FMR a 1.5 mm magnetic PCB laminate formed by 10 layers of 3 μm MnZn-ferrite/100 μm FR4/3 μm MnZn-ferrite attached with a thin layer of 50 μm prepre. FIG. 12B shows the calculated real permeability and imaginary permeability graph 1110 from the results of FIG. 12A. 1211 is the real permeability, which shows a value of 103 in frequencies ranges of 10-800 MHZ, a better value than the one in FIG. 11B. As shown in FIG. 12B, at around 800 MHZ, the magnetism of this ferrite PCB laminate was completely lost.

The above measured data indicate that magnetic PCBs are functionally superior and stable in frequencies 10-800 MHz.

Figure 13:
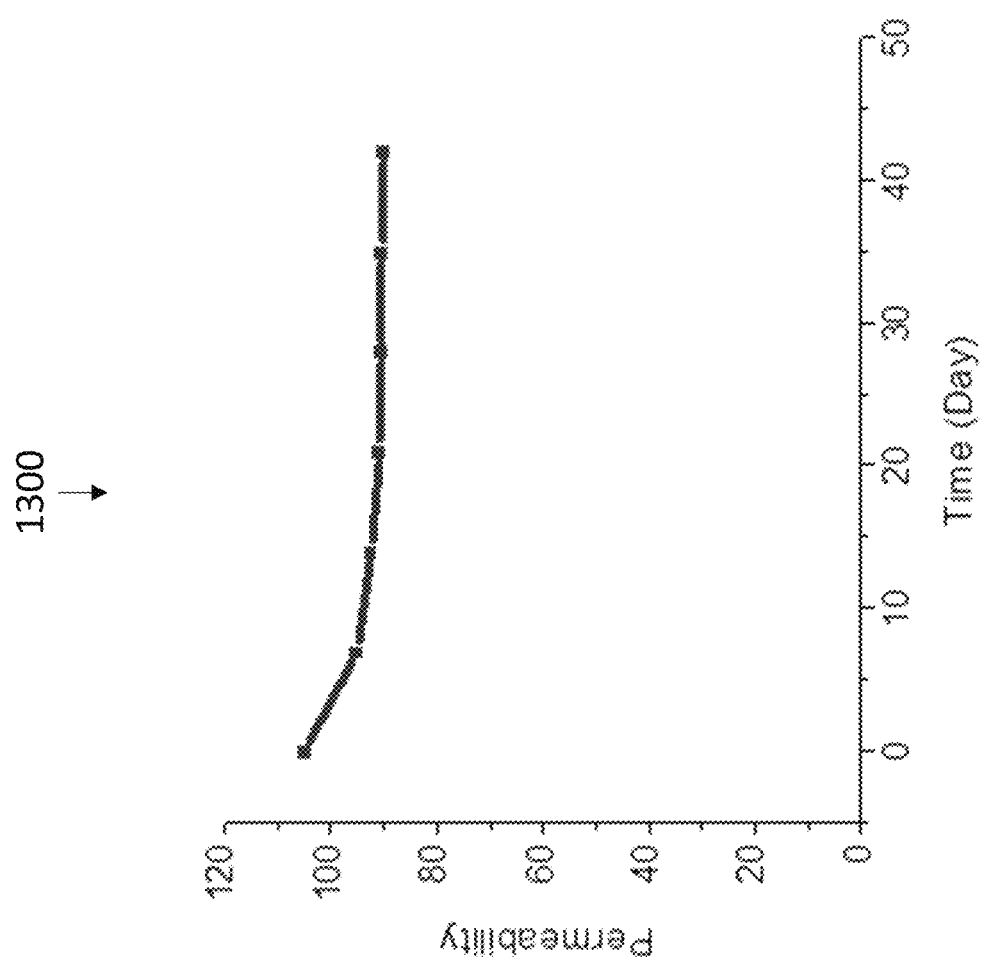
FIG. 13 is the real permeability of the 0.65 mm thick Ferrite PCB of FIG. 2 during a period of two months, showing a stable high permeability over time.

FIG. 13 shows the permeability measurement of the 0.65 mm thick Ferrite PCB laminate of FIG. 8A for two months, showing a stable high permeability for this period.

Example 6: Antennas Using Ferrite Filmed PCB Assemblies

FIG. 14A shows a fabricated and soldered PCB 1403 of a T-shaped matching network 1400 with 5-turn solenoid magneto-dielectric antenna 1401 based on a blank 25.4 mm×12.7 mm×1.3 mm PCB 1405 (of light color). FIG. 14B shows a fabricated and soldered PCB 1413 of a T-shaped matching network 1410 with 5-turn solenoid magneto-dielectric antenna 1411 based on a ferrite PCB 1415 (of dark color due ferrite coating) with the same size of 25.4 mm×12.7 mm×1.3 mm. The magnetic PCB is from FIG. 12A and both magnetic and blank PCBs are of 1.5 mm thickness.

Figure 15A:
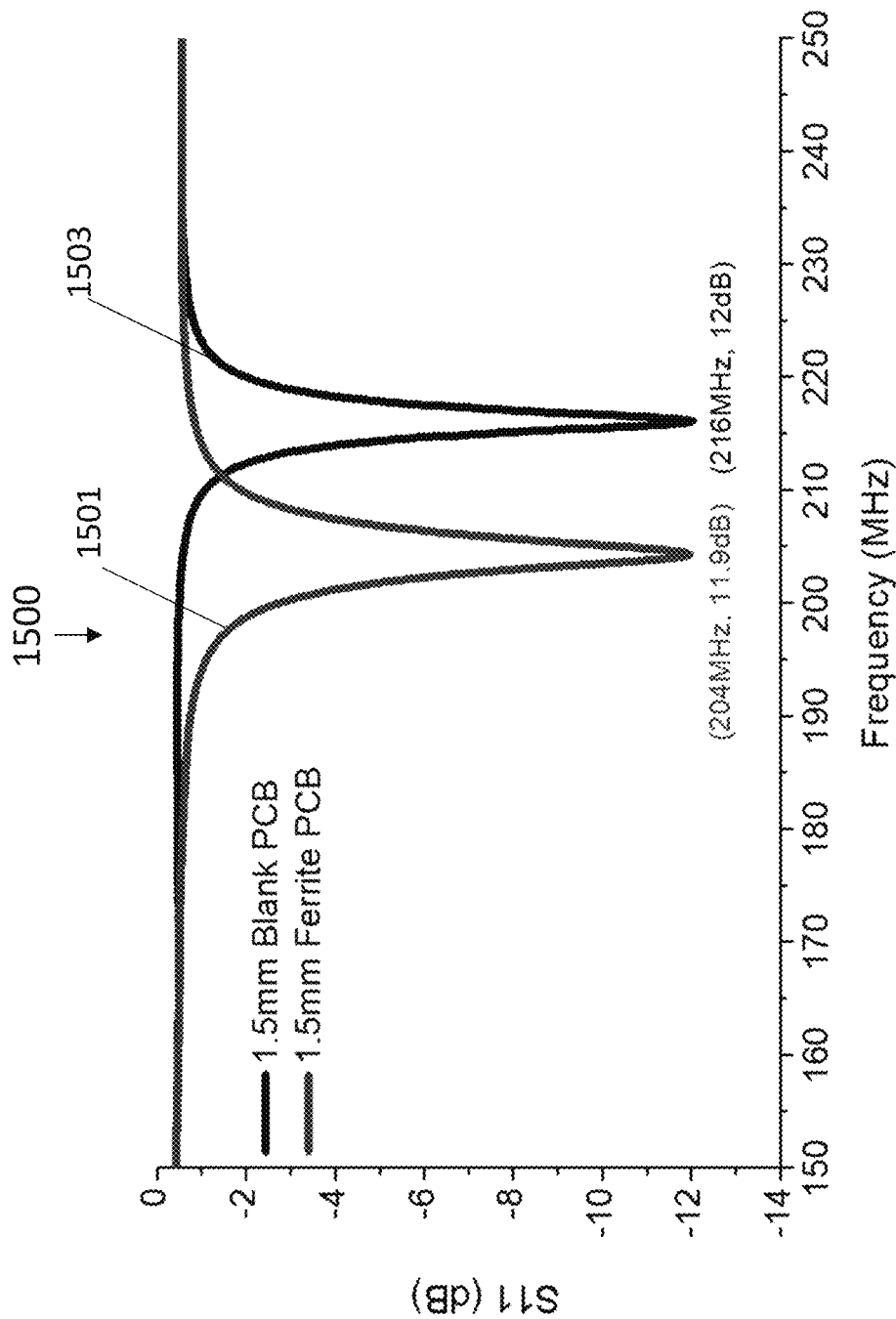
FIG. 15A is the S11 measurement of the 5-loop solenoid antennas of FIG. 14A and FIG. 14B at 30~300 MHz.
Figure 15B:
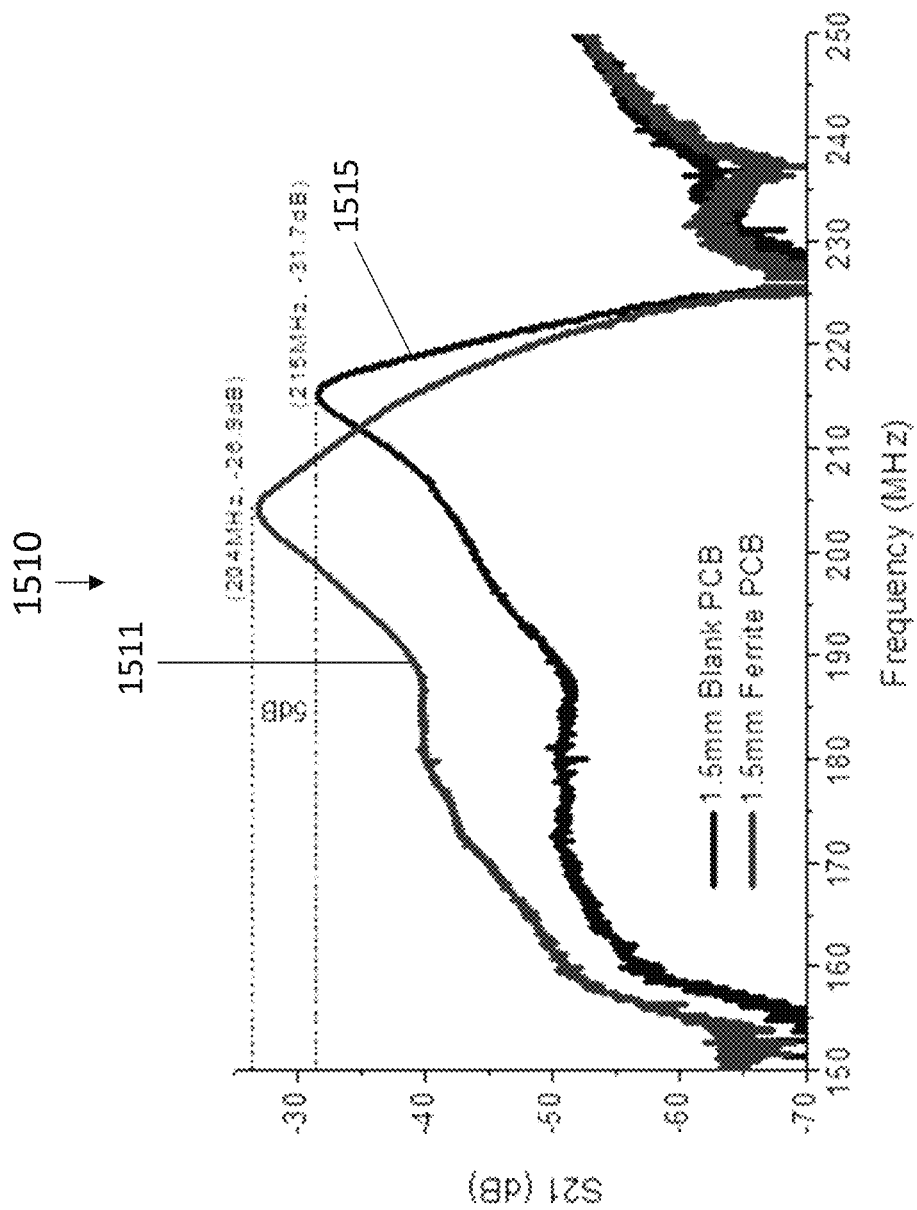
FIG. 15B is the S21 measurement of the 5-loop solenoid antennas of FIG. 14A and FIG. 14B at 30~300 MHz for comparison.

FIG. 15A shows the S11 comparison 1500 of the 5-loop solenoid antennas shown in FIG. 14A and FIG. 14B. These result shows a return loss of the solenoid magneto-dielectric antenna based on magnetic PCBs with the dimension of 25.4 mm×12.7 mm×1.5 mm. In frequency range of 30~300 MHz, matching networks were not tuned, and there is a resonance frequency shifts from 216 MHz (blank PCB, 1503) to 204 MHz (magnetic PCB, 1501). In reference to FIG. 15B, the S21 comparison 1510 is calculated. At the resonance frequency of 204 MHz, the magnetic PCB antenna enhances the gain by 5 dB (plot 1511) compared to the antenna based on the blank PCB (plot 1515). Therefore, the present invention can design small-size antennas having improved antenna gains and bandwidths and various low resonance frequencies by using a high permeability magnetic PCB.

Example 7: Inductors Using Ferrite Filmed PCB Assemblies

Figure 16A:
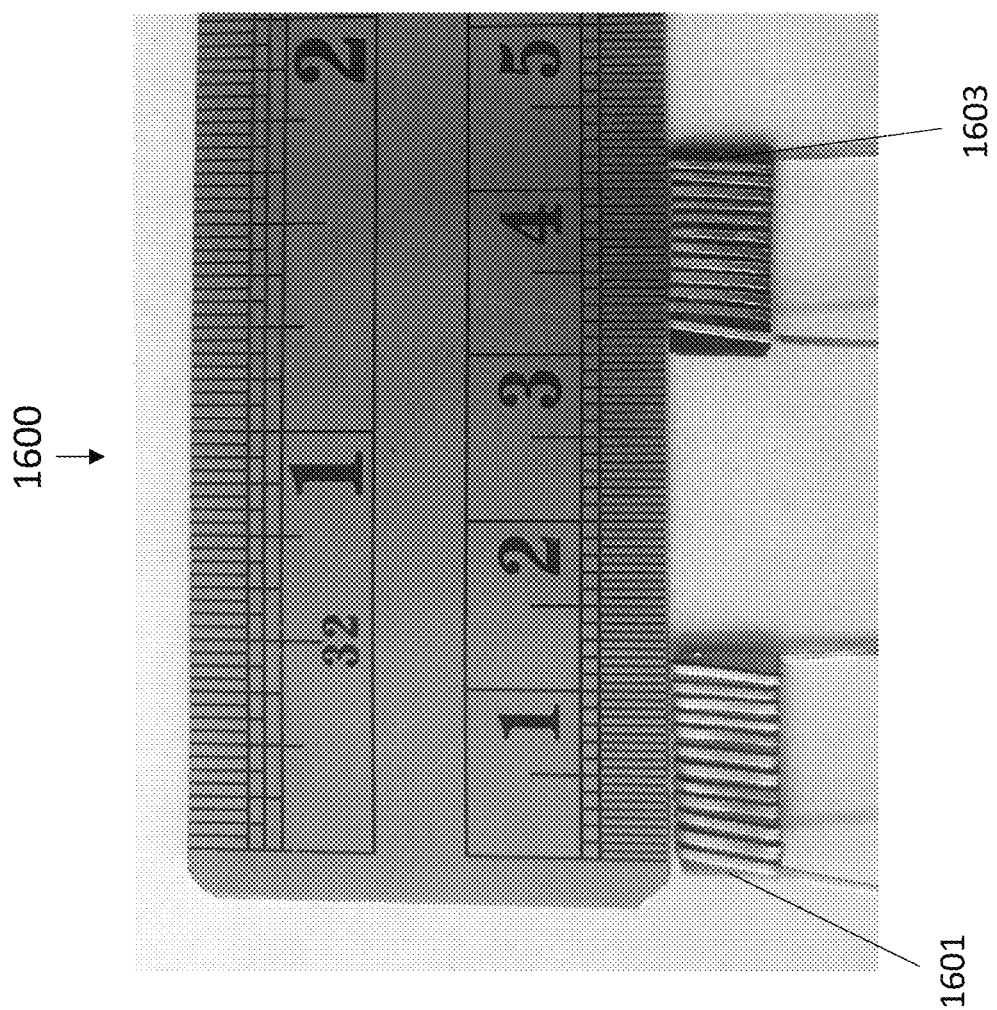
FIG. 16A is an image of two power inductors with the core size of 5 mm by 12 mm with or without the 20 layers MnZn Ferrite films on Kapton.
Figure 16B:
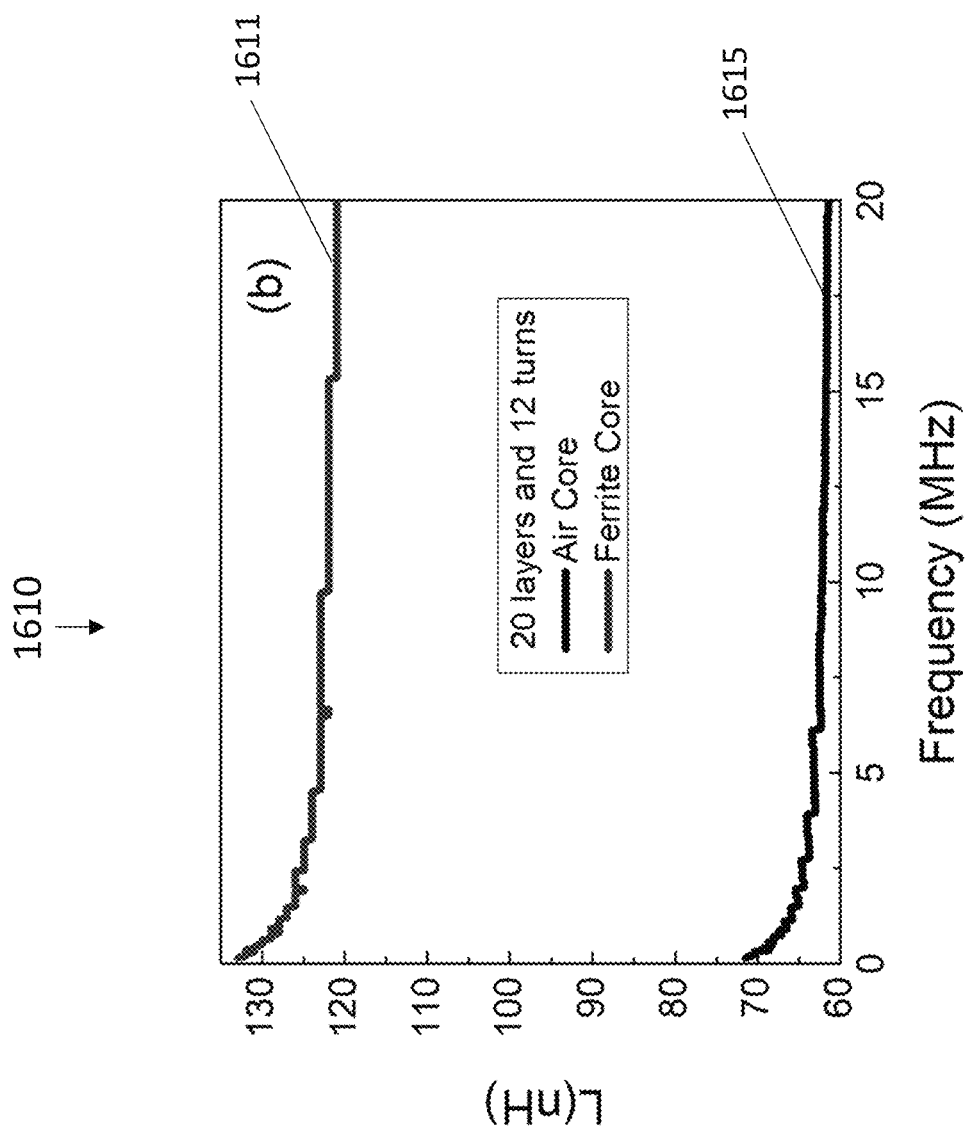
FIG. 16B shows the inductances of the power inductors in FIG. 16A.
Figure 16C:
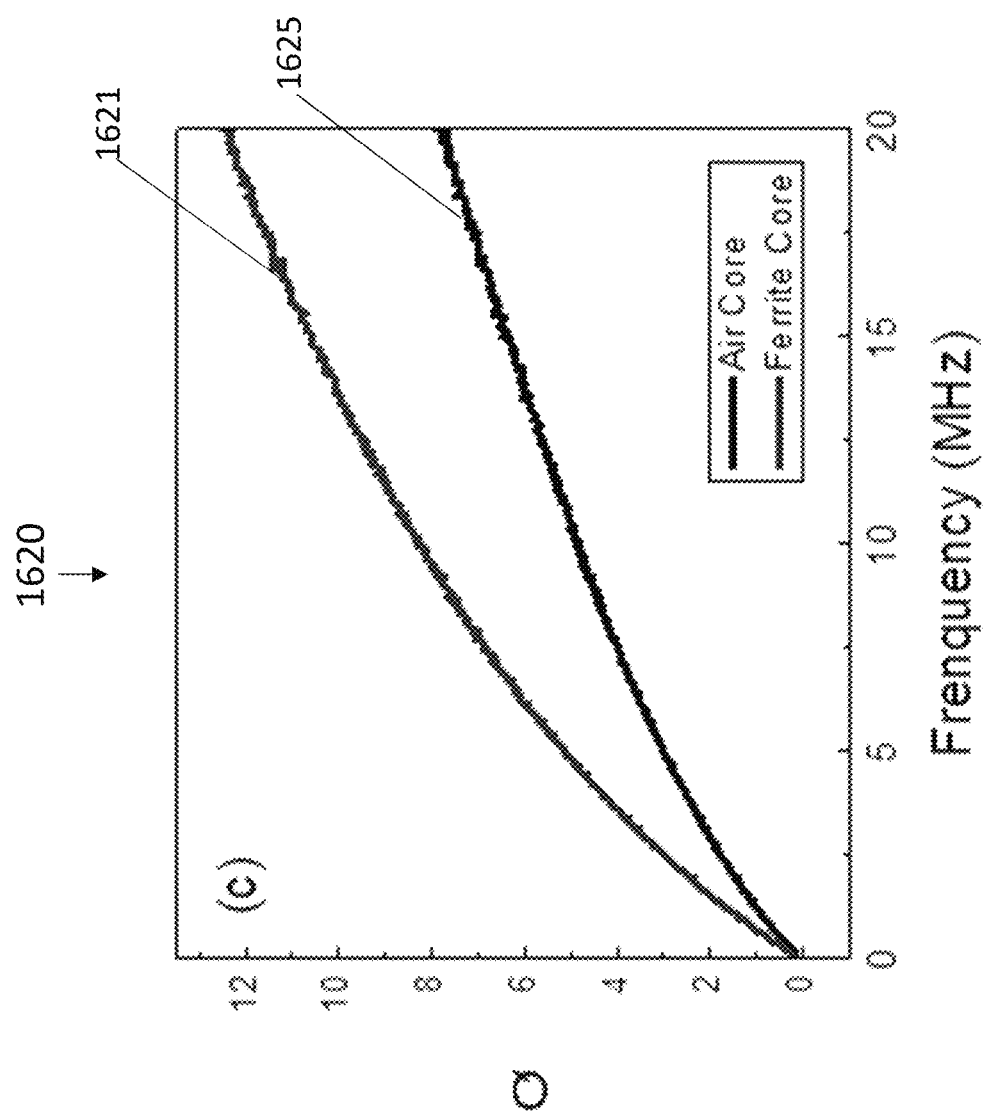
FIG. 16C shows the quality factors of the inductors in FIG. 16A.

FIG. 16A shows the images of a power inductor 1603 based on 20 layers MnZn ferrite filmed Kapton PCBs (1603) with the core size of 5 mm by 12 mm and a power inductor 1601 with same sized un-coated Kapton PCBs. FIG. 16B shows the inductance comparison graph 1610 between the two inductors. FIG. 16C shows the quality factor comparison graph 1620 between the two inductors.

FIG. 16B shows a significant higher inductances (plot 1611) in MnZn ferrite filmed Kapton PCB inductor, exhibiting nearly constant inductance, compared to the uncoated Kapton PCBs inductor (plot 1615). FIG. 16C shows a significant higher quality factor 1621 at MHz frequencies over their air core counterparts (plot 1625), exhibiting about 96% enhancement between 150 kHz~20 MHz relative to the air core inductor.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

Additional general background, which helps to show variations and implementations, may be found in the following publications, all of which are hereby incorporated by reference herein for all purposes:
1. "Antennas", Kraus, J. D. 2nd Ed, MacGraw Hill, 1988;
2. "Broadband Ferrite Loaded Loop Antenna", Meloling John Harold, Dawson David Carlos, Hansen Peder Meyer, U.S. Pat. No. 7,737,905, 2010;
3. "Ferrite Antenna", Huf Huelsbeck, Fuerst G, and Neosid Pemetzrieder, U.S. Pat. No. 6,919,856, 2005;
4. "Twin coil antenna", Christopher M. Justice, U.S. Pat. No. 6,529,169, 2003;
5. "Millimeter thick magnetic print circuit boards (PCBs) with a high relative permeability of 50~150 and related devices and systems" Xiaoling Shi, Hui Lu, Nian Sun, Winchester Technologies, LLC, Burlington, MA 01803. US Patent application.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle. The claims as filed are intended to be as comprehensive as possible, and NO subject matter is intentionally relinquished, dedicated, or abandoned.

What is claimed:
1. A spin-spray deposited M(x)Zn(1-x)-ferrite magnetic PCB, comprising:
 a film of ferrite deposition having a formula M(x)Zn(1-x)-ferrite wherein M represents a metal ion selected from Zn, Mn, and a mixture thereof, and x represents a ratio between M and Zn, ranging 0.1 to 0.9; and a layer of a substrate, wherein the film of ferrite deposition by chemical reaction resulting in forming a ferrite film on the layer of the substrate through a spin-spray mechanism by spraying on the layer of the substrate with a spin spray reaction solution comprising $FeCl2$ and $MCl2$ where M represents a metal ion selected from Zn, Mn and a mixture thereof, and simultaneously spraying on the layer of the substrate an oxidizing buffer solution, while the substrate is simultaneously heated to a temperature between 20-100° C. and rotated at a speed between 5-1000 rpm; and said ferrite magnetic PCB having a ferromagnetic resonance in the range of 5 to 800 MHz and a magnetic relative permeability greater than 300 and a high saturation magnetization greater than 0.3 T.

2. The ferrite magnetic PCB of claim 1, wherein the oxidizing buffer solution is a $NaNO_2$ acetate buffer provided in atomizing liquid droplets.

3. The ferrite magnetic PCB of claim 1, wherein the layer of the substrate has a panel dimension between 1 inch to 48 inches, thickness between 100 μm to 1 mm; and the film of ferrite deposition has a thickness in a range between 50 nm and 20 μm.

4. The multiple layered ferrite magnetic PCB assembly of claim 1 is a panel of size less than 48"×48", having a thickness of about 0.05 to 12 mm and the polymer is thermoset resin.

5. A method for providing an antenna comprising the step of using a magnetic PCB of claim 1 as a PCB.

6. A method for providing a transformer comprising the step of using a magnetic PCB of claim 1 as a PCB.

7. A method for providing a compact inductor comprising the step of using a magnetic PCB of claim 1 as a PCB.

8. The ferrite magnetic PCB of claim 1, wherein said ferrite magnetic PCB has a magnetic loss tangent—the ratio of its Imaginary permeability over its Real permeability less than 10%.

9. The ferrite magnetic PCB of claim 3, wherein the substrate is a FR4, TMM10i, Si, glass, printed circuit board, or a transparency.

10. A multiple layered ferrite magnetic PCB assembly, comprising
a plurality layers of ferrite coated PCB substrates, each layer comprising a substrate layer having a thickness of 100 μm to 1 mm, and at least one layer of ferrite film coated on at least one side of said layer of substrate, said plurality layers of ferrite coated PCB substrates being laminated together with a layer of polymer by heating the layered assembly to form the ferrite film PCB laminate;
wherein the number of said layers of ferrite coated PCB substrates is two or more; and said ferrite is coated by chemical reaction resulting in a ferrite film on each said substrate layer through a spin-spray mechanism by spraying on the substrate layer with a spin spray reaction solution comprising $FeCl2$ and $MCl2$ where M represents a metal ion selected from Zn, Co, Mn, Cu, Ni and a mixture thereof, and simultaneously spraying on the layer of the substrate an oxidizing buffer solution, while the substrate is simultaneously heated to a temperature between 20-100° C. and rotated at a speed between 5-1000 rpm, said layer of ferrite coated PCB has a magnetic relative permeability greater than 300 and a magnetic relative and a high saturation magnetization greater than 0.3 T; and said multilayered ferrite magnetic PCB has ferromagnetic resonance in the range of 5 to 800 MHz and a magnetic loss tangent— the ratio of Imaginary permeability over Real permeability, less than 10%.

11. The multiple layered ferrite magnetic PCB assembly of claim 10, wherein one or more ferrite coated PCB substrates are generated by simultaneously spraying of a ferrite ion solution and an oxidant buffer solution in the form of atomizing liquid droplets on a heated and spinning substrate.

12. A method for providing a compact inductor comprising the step of using a magnetic PCB of claim 10 as a PCB.

13. A method for providing a transformer comprising the step of using a magnetic PCB of claim 10 as a PCB.

14. A method for providing an antenna comprising the step of using a magnetic PCB of claim 10 as a PCB.

* * * * *